United States Patent [19]

Udren

[11] Patent Number: 4,528,678
[45] Date of Patent: Jul. 9, 1985

[54] NONLINEAR NOISE REDUCTION APPARATUS WITH MEMORY

[75] Inventor: Eric A. Udren, Monroeville, Pa.

[73] Assignee: Westinghouse Electric Corp., Pittsburgh, Pa.

[21] Appl. No.: 510,784

[22] Filed: Jul. 5, 1983

[51] Int. Cl.³ .............................................. H04B 1/10
[52] U.S. Cl. ..................................... 375/104; 328/165
[58] Field of Search .................... 375/99, 104; 358/36; 455/220, 223; 328/162, 165

[56] References Cited

U.S. PATENT DOCUMENTS

| | | | |
|---|---|---|---|
| 3,588,705 | 6/1971 | Paine | 455/223 |
| 3,711,777 | 1/1973 | Tink | 375/104 |
| 4,419,541 | 12/1983 | Kishi et al. | 455/223 |
| 4,479,251 | 10/1984 | Dawson | 455/223 |
| 4,479,252 | 10/1984 | Souchay et al. | 455/223 |

Primary Examiner—Robert L. Griffin
Assistant Examiner—Stephen Chin
Attorney, Agent, or Firm—William E. Zitelli

[57] ABSTRACT

A nonlinear noise-blanking circuit with memory. An information signal corrupted by a noise signal is input to the nonlinear noise-blanking circuit. The information signal is blanked during noise impulses and an estimate for the blanked information signal is inserted therein. Various embodiments of the invention disclose means for determining an appropriate estimate. For example, the estimate can be a simple positive or negative dc value corresponding to the sign of the information signal prior to noise corruption. Alternatively the first and second derivatives of the information signal prior to noise corruption can be used to generate an expected future trajectory of the information signal, and this value inserted in the information signal during the blanked interval. Also, a sample and hold circuit can be used to "remember" the value of the information signal prior to the inception of a noise impulse. This "remembered" value is then inserted in the information signal during the blanked interval.

68 Claims, 24 Drawing Figures

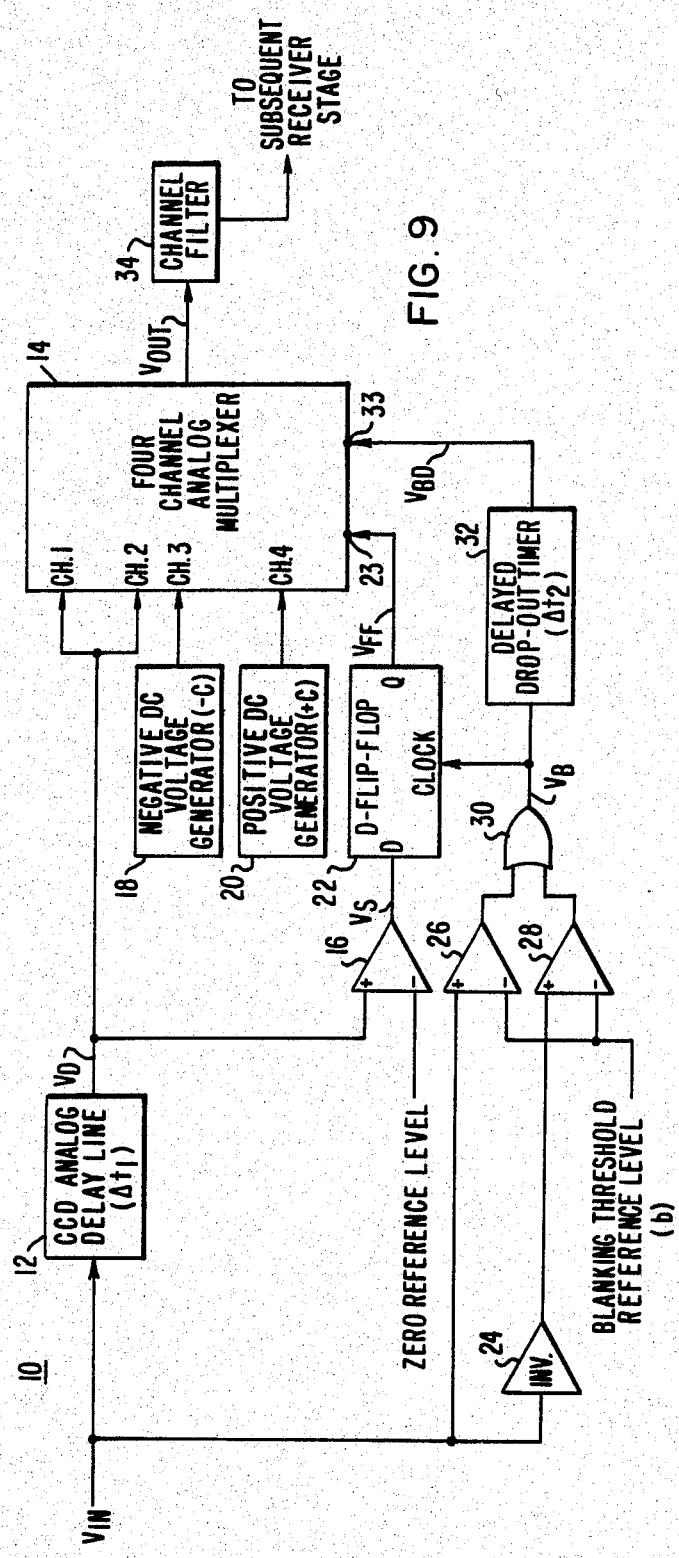

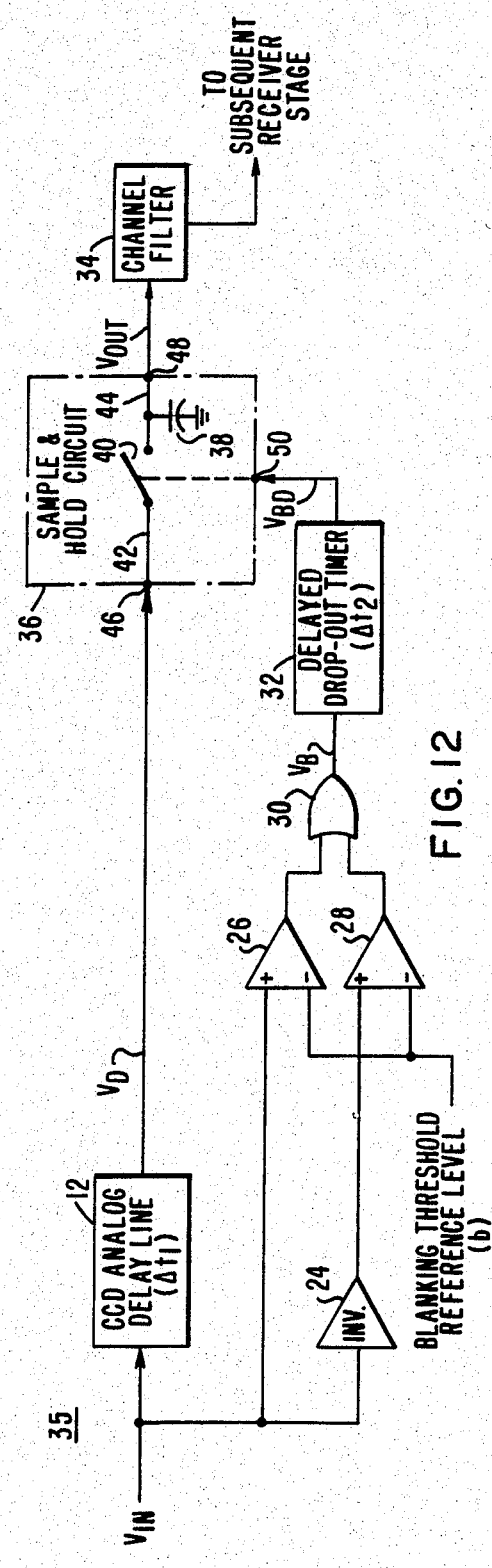
FIG. 12
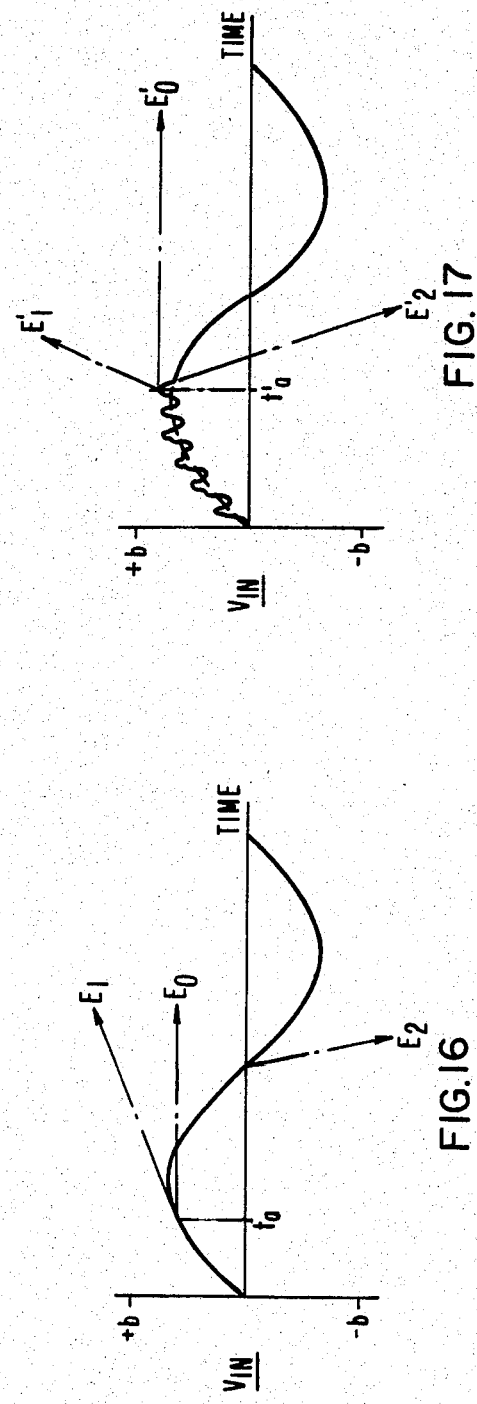
FIG. 17
FIG. 16

NONLINEAR NOISE REDUCTION APPARATUS WITH MEMORY

BACKGROUND OF THE INVENTION

1. Field of the Invention

This invention relates in general to noise reduction apparatus for reducing the detection errors caused by noise impulses in communications channels, and especially to such noise reduction apparatus employing memory and nonlinear techniques to examine the signal waveform prior to a noise impulse, remove the impulse, and substitute for the impulse the most likely waveform trajectory based on the signal's trajectory prior to the noise impulse.

2. Description of the Prior Art

Communications channels are subject to two types of noise. The first type is thermal or Gaussian noise caused by the random motion of charged particles (usually electrons) in the channel. Gaussian noise is characterized by wide bandwidth and relatively low magnitude. The second type of noise, noise impulses, are often produced by man-made devices, including engine ignition systems and motors. The impulses are characterized by wide bandwidth, fast rise and fall times, short duration compared to the highest frequency signal element, and possibly large amplitude. Traditional communications receiver design neglects impulsive noise and considers only Gaussian noise in the communications frequency band. To reduce the effects of in-band Gaussian noise, receivers employ channel selection filters to eliminate out-of-band Gaussian noise or sufficient signal power must be available to yield a useable signal-to-noise ratio at the receiver (considering channel attenuation and in-band Gaussian noise power at the receiver).

The impulses, which are often orders of magnitude larger than the peak information signal amplitude, can totally obliterate communications. If, however, they are of short duration compared to a transmitted digit interval or a cycle of the highest analog-signal frequency, their effect can be totally eliminated using prior art nonlinear schemes discussed below. Even longer impulses disrupting one or more message elements can be prevented from interacting with receiver filters by these prior art techniques, thereby avoiding prolonged disruption of the signal; an error-correcting code can be used to achieve reliable message transmission despite impulse-induced detection errors on some data bits or signal portions. Since a large class of real-world interference sources are of the impulse type, their effect can be diminished using conventional prior art nonlinear techniques, and especially the memory-nonlinear techniques of the present invention.

The prior art nonlinear techniques and the memory-nonlinear technique of the present invention are discussed herein in terms of digital signals and periodic sampling of signal waveforms. These discussions are also valid for continuous-time processing of digital signals and for analog signals. The techniques are applicable to any signal type, either baseband or modulated-carrier.

A communications receiver usually includes frequency-selective filters to reject unwanted signals and out-of-band Gaussian noise. When shocked by a large-amplitude broadband impulse, these filters produce a prolonged output, longer than the original impulse, that may destroy a long string of received data bits. For any type of nonlinear circuit to be useful, it must differentiate between the time-domain properties of the impulse and the signal. By cutting off or blocking out signal voltages rising too fast or too high to have been transmitted as part of the desired message, the prior art nonlinear circuits actually remove impulse energy lying both inside and outside the communications frequency band. The in-band portion would otherwise pass through the filter circuits and produce the prolonged output. A nonlinear circuit, placed ahead of the filters, takes advantage of the distinct time-domain properties of the impulse to reflect most of the energy before it enters the filter circuits. To preserve the shape of the impulse before it reaches the nonlinear stage, the channel portion through which the impulse propagates, and any receiver circuits ahead of the nonlinear circuit, must have a relatively wide bandwidth. In complex receivers with several stages of increasingly fine sub-channel selection, a single nonlinear circuit can be placed ahead of the first filter stage, or several nonlinear circuits can be used ahead of successively more selective filter stages. Several prior art examples of such nonlinear circuits are discussed below, including clippers, noise blankers, and hard limiters.

These prior art nonlinear circuits employ zero-memory nonlinearity techniques. That is, the output at any instant depends on the input only at that same instant. Masking of the noise impulse can be greatly improved, however, if the nonlinear circuit considers the immediately previous history of the signal and attempts to insert an estimate, using this previous history, for that portion of the signal corrupted by the impulse. The signal remains a smooth wave, free of clipped spikes, possibly of the wrong sign, or holes in the signal where it was corrupted by the noise impulse. The insertion of an accurate estimate during the time of corruption, based on the previous state of the signal waveform, is the essence of the present invention.

SUMMARY OF THE INVENTION

The present invention is a nonlinear noise-blanking circuit with memory that is responsive to an information signal distorted by noise impulses. The distorted information signal is delayed by a delay line. In a parallel path, the distorted information signal is processed to determine whether any portion thereof exceeds a positive or negative threshold. If the noise impulses cause the information signal to exceed either of the threshold boundaries a timer is activated. While the timer is active the delayed and distorted information signal from the delay line is blanked and an approximate value is inserted into the blanked interval. The approximation can be a simple positive or negative dc value (dependent on the sign of the information signal), or it can be produced by a derivative-based analysis using the history of the information signal prior to interruption by the noise impulse. As a result, the output signal from the nonlinear noise-blanking circuit comprises the approximate value when the timer is active and comprises the information signal, delayed by the delay line, when the timer is inactive. The memory-nonlinear circuit of the present invention therefore has the potential of suppressing noise impulses far more effectively than prior art nonlinear methods. The result is a lower error detection rate and a possible reduction in required transmitter power.

BRIEF DESCRIPTION OF THE DRAWINGS

This invention may be better understood, and further advantages and uses thereof more readily apparent, when considered in view of the following detailed description of exemplary embodiments, taken with the accompanying drawings in which:

FIG. 9 is a partial schematic and partial block diagram of a memory-nonlinearity circuit constructed according to the teachings of the present invention;

FIG. 10 is a table of the input and output signals for the D flip-flop of FIG. 9;

FIG. 12 is a partial block diagram and partial schematic of a second embodiment of the memory-nonlinearity circuit of the present invention;

FIG. 16 is a waveform graph waveform illustrating operation of the memory-nonlinearity circuit of FIG. 15;

FIG. 17 is a waveform graph illustrating the affect of wide-band Gaussian noise on the operation of the memory-nonlinearity circuit of FIG. 15;

DESCRIPTION OF THE PREFERRED EMBODIMENTS

To better understand the operation, advantages, and inventive features of the present invention, it is important to first examine the prior art nonlinearity circuits, without memory, illustrated in FIGS. 1-8.

Figure 1A:
FIGS. 1A and 1B show the input and output signals, respectively, for a prior art clipper nonlinear technique.
Figure 1B:
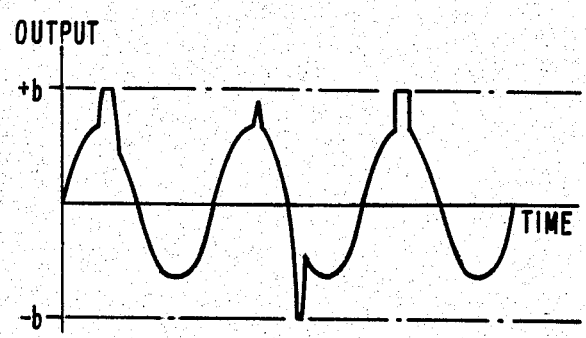
Figure 2:
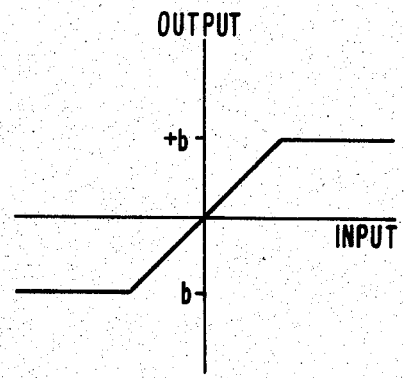
FIG. 2 shows a characteristic input/output curve for the clipper nonlinear technique.

Turning to FIG. 1A there is shown an information signal input to a clipper nonlinearity circuit; the output signal from the clipper nonlinearity circuit is illustrated in FIG. 1B. Note that when the noise impulses exceed the clipping thresholds +b or −b the information signal is clipped and the output signal is held constant at a magnitude of +b or −b. The characteristic input/output curve for the clipper nonlinearity is illustrated in FIG. 2 where the input signal is graphed on the X axis and the output is graphed on the Y axis. As can be seen, the clipper nonlinearity circuit characteristic curve has a positive unit slope between the thresholds. Information signals having a magnitude in excess of +b are clipped such that the output signal magnitude is held at +b. Similarly, negative-going portions of the input signal exceeding the negative threshold produce an output signal having a constant magnitude of −b. As is the case with all nonlinearities to be discussed herein, the energy represented by the area of the curve under the impulse and above the clipping thresholds is shorted or dissipated completely in the source impedance.

To provide the clipper nonlinearity technique illustrated in FIGS. 1A, 1B, and 2 a pair of zener diodes connected in series opposition and shunted across the signal lines can be used. If the threshold is to be varied, parallel rectifier diodes each having a series bias source can be used. Also, a comparator or pair of comparators can be used to implement the clipper non-linearity technique. Subsequent filtering is necessary to smooth the sharp discontinuities caused by the clipping process. In a variation of this technique, a circuit is used to detect signal peaks and to produce a slow time-varying bias; this circuit is known as an automatic noise limiter. All of these clipper nonlinearity techniques are well known in the prior art.

Figure 3A:
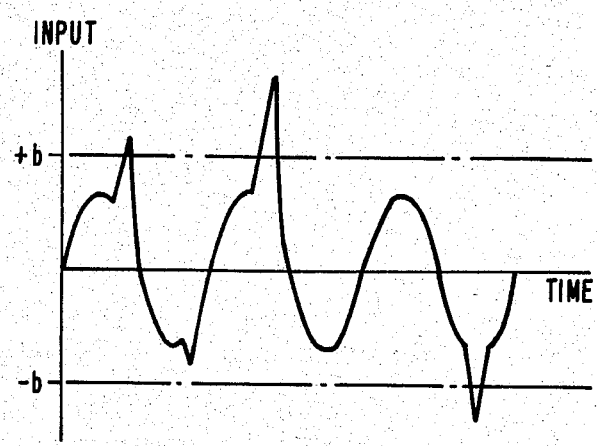
FIGS. 3A and 3B illustrate the input and output signals, respectively, for a prior art noise-blanker nonlinear technique.
Figure 3B:
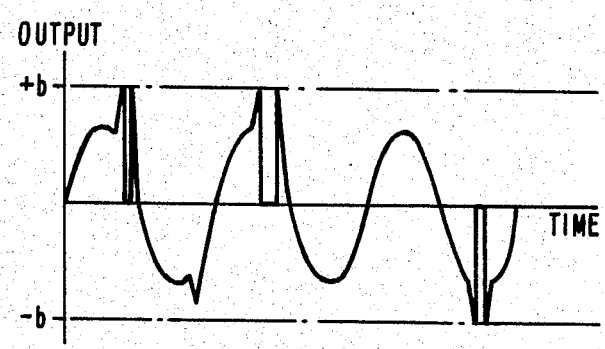
Figure 4:
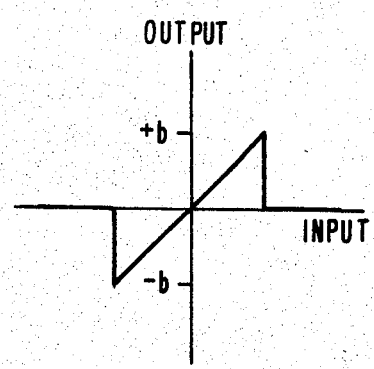
FIG. 4 shows the characteristic input/output curve for the prior art noise-blanker nonlinear technique.

FIG. 3A illustrates an information signal distorted by noise impulses, and FIG. 3B shows the output signal from a noise-blanker nonlinear processing circuit with the signal of FIG. 3A input thereto. Note that if the signal exceeds the threshold +b or −b the output is forced to zero. As a result, the noise-blanker nonlinear circuit completely suppresses the information signal during a noise impulse. Subsequent filtering is necessary to smooth the discontinuities, although in this case the filter must draw energy from adjacent signal values to fill in the holes resulting from the noise impulse. This is in contrast to the clipper nonlinearity technique wherein the filter must spread excess energy. The input/output characteristic curve for the noise-blanker nonlinear circuit is illustrated in FIG. 4. Note that when the input magnitude exceeds +b or −b the output is zero. Between the two threshold points the output tracks the input.

Figure 5A:
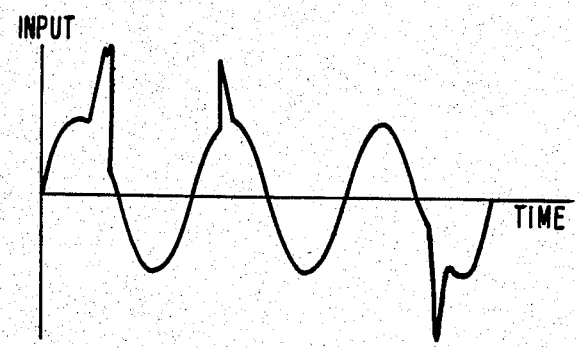
FIGS. 5A and 5B show the input and output signals, respectively, for a prior art hard-limiter nonlinear technique.
Figure 5B:
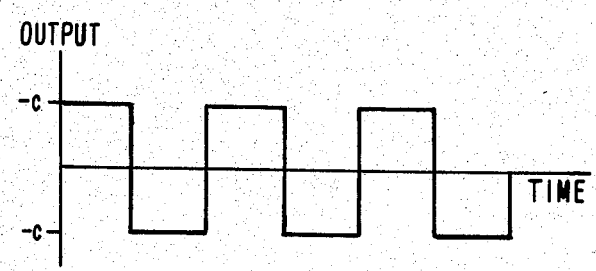

FIGS. 5A and 5B illustrate the function of a hard-limiter nonlinear processing circuit. The waveform of FIG. 5A is a sinusoidal signal distorted by noise impulses; the result of processing the waveform of FIG. 5A through a hard-limiter nonlinear circuit is illustrated in FIG. 5B. Note that the hard-limiter nonlinear circuit replaces the original signal waveform with one of two fixed output levels, i.e., +c or −c, as illustrated in FIG. 5B. Although this drastic processing technique has little affect on bipolar baseband information signals, sinusoidal carriers are obviously converted to square waves, and selective filters are mandatory to restore the signal to its original waveform.

Figure 6:
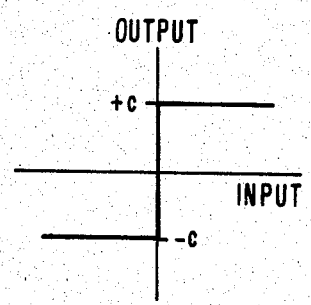
FIG. 6 shows the characteristic input/output curve for the prior art hard-limiter nonlinear technique.

The input/output characteristic curve for the hard-limiter nonlinear technique is illustrated in FIG. 6. As can be seen, if the input is positive, the output has a value of +c; if the input signal is negative the output has a value of −c. Hard-limiter nonlinear circuits are easily configured, as is well known in the art, using a comparator or an ac-coupled and properly biased logic gate.

Figure 7A:
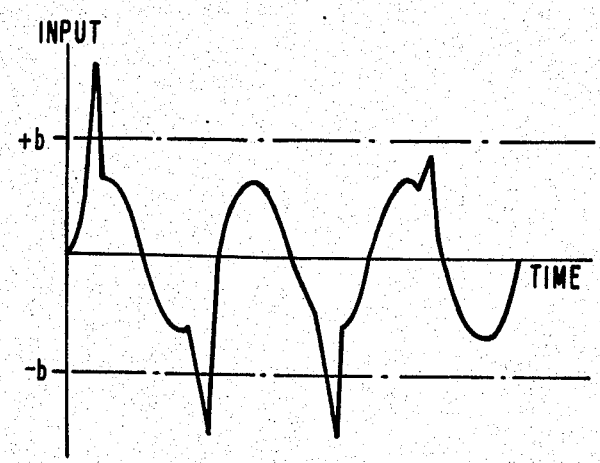
FIGS. 7A and 7B illustrate the input and output signals, respectively, for a prior art sub-optimum nonlinear technique.
Figure 7B:
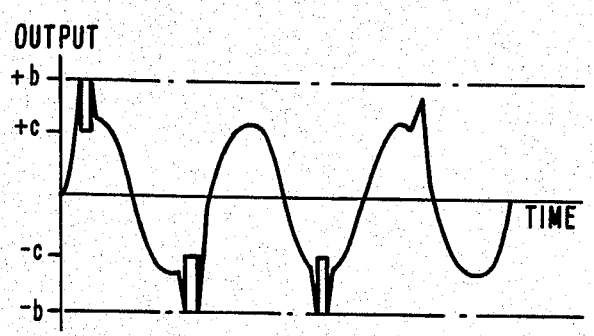
Figure 8:
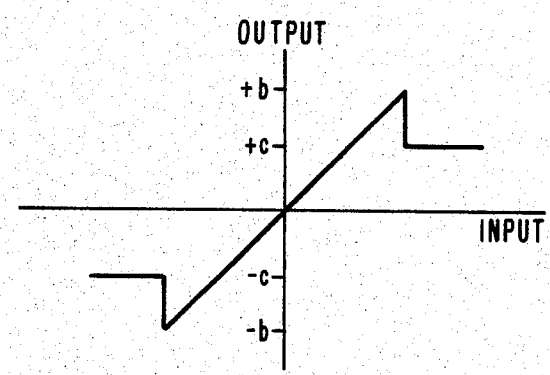
FIG. 8 shows the characteristic input/output curve for the sub-optimum nonlinear technique.

A more optimum nonlinear processing technique than those discussed above is considered in conjunction with FIGS. 7A, 7B, and 8. This prior art sub-optimum nonlinear processing technique uses different values for the threshold and the signal estimate. A sinusoidal information signal distorted by noise impulses is illustrated in FIG. 7A. After processing through the sub-optimum nonlinearity the resulting waveform is illustrated in FIG. 7B. The signal thresholds +b and −b are chosen as in the prior art techniques discussed above. The estimates ±c are chosen to minimize the mean-square error of estimation over an ensemble of many noise impulses. This is readily accomplished by using the RMS signal value as the positive and negative estimates. For full-width bipolar baseband pulses in an unlimited bandwidth channel, the RMS value is equal to the signal pulse height; the pulse height therefore serves as the estimate. For a sinusoidal carrier having no amplitude modulation, the estimate ±c equals 0.7 times the carrier peak. If amplitude modulation is used, the RMS amplitude of the envelope is multiplied by 0.7 to obtain ±c. FIG. 8 illustrates the input/output characteristic curve for the sub-optimum nonlinear processing technique.

The summarize these prior art noise limiting techniques, note that with the sub-optimum technique an estimate ±c is injected if the signal exceeds ±b. If it is desirable to avoid the complexity of injecting estimates, only slightly inferior results are obtained by using the clipper, hard-limiter, or noise-blanker non-linear techniques. If the estimate is near the signal value (such as for a constant-envelope sinusoidal carrier) the clipper technique is better; signals having low RMS-to-peak ratios are better processed through a noise blanker. Binary baseband pulses can be effectively treated with a hard-limiter.

In virtually all real-world communications channels, the noise impulses occur at random times with respect to the signal wave; the impulses themselves may also be of random sign. Therefore, in about half the cases of signal corruption, the impulse has a polarity opposite of the signal. If the peak amplitudes of the impulses are substantially larger than the signal, as is often the case, the impulse drives the signal across the blanking or clipping threshold whose sign is opposite that of the signal. Now, if the sub-optimum nonlinear technique is used, the inserted estimate has the wrong sign. With high-magnitude impulses only slightly over half the estimates are correct and nearly half are wrong; the net benefit of using a sub-optimum nonlinear technique is not much greater than if an estimate of zero is inserted for every noise impulse. Thus, a simple noise-blanker technique should work almost as well as the sub-optimum non-linear technique. As the impulse magnitude approaches infinity, the sub-optimum and noise-blanker nonlinear techniques should yield equal error performance.

All of the nonlinear techniques discussed above are known as zero-memory nonlinear techniques because they process only the instantaneous signal plus noise value using an a priori design approach to minimize effects of the noise impulses. The serious limitations of this scheme are apparent in the high-amplitude impulse situation discussed above. Recall that in this case it was noted that a high-amplitude impulse could drive the signal into the region of opposite sign and thereby render an estimate of incorrect sign. As will be shown, it is possible to improve the estimating process, especially with respect to the sign of the estimate, by remembering where the signal amplitude was prior to a noise impulse that causes the signal amplitude to exceed the threshold.

This then is the essence of the present invention wherein the estimating process is dynamic and uses the actual information signal waveform behavior just prior to the interfering noise impulse to determine the estimate. Using the trajectory of the signal prior to the noise impulse, the most likely future trajectory is determined and the estimate based thereon. With knowledge of the statistics of the signal, the in-band Gaussian noise, and the impulsive interference, it is possible to insert an estimate in the corrupted information signal that is significantly more accurate than the prior art techniques discussed above.

A memory-nonlinearity circuit 10 is illustrated in FIG. 9. A signal $V_{IN}$, comprising an information signal distorted by noise impulses, is input to a charge-coupled-device analog delay line 12 for delaying $V_{IN}$ by $\Delta t_1$, to produce a signal $V_D$ that is representative of the signal $V_{IN}$. The signal $V_D$ is input to channel one and channel two input terminals of a four-channel analog multiplexer 14. The signal $V_{IN}$ is also input to a non-inverting input terminal of a comparator 26 and to an inverter 24. An output signal from the inverter 24 is input to a non-inverting terminal of a comparator 28. A blanking threshold reference level signal (b) is input to an inverting input terminal of the comparator 26 and to an inverting input terminal of the comparator 28. A first terminal of an OR gate 30 is connected to an output terminal of the comparator 26; a second input terminal of the OR gate 30 is connected to an output terminal of the comparator 28. An output signal $V_B$ from the OR gate 30 is input to a clock terminal of a D flip-flop 22 and to a delayed drop-out timer 32. The delayed drop-out timer 32 produces a signal $V_{BD}$; the signal $V_{BD}$ goes to a high state whenever the signal $V_B$ input to the delayed drop out timer 32 goes high. The signal $V_{BD}$ goes low $\Delta t_2$ after the signal $V_B$ goes low.

The signal $V_D$ from the charge-coupled-device analog delay line 12 is input to a non-inverting input terminal of a comparator 16. A zero reference level signal is input to an inverting input terminal of the comparator 16. The comparator 16 produces an output signal $V_S$ that is input to a D input terminal of the D flip-flop 22. A signal $V_{FF}$ produced at a Q output terminal of the D flip-flop 22 is input to the four-channel analog multiplexer 14 at an input terminal 23 thereof. The signal $V_{BD}$ from the delayed drop out timer 32 is input to an input terminal 33 of the four-channel analog multiplexer 14.

A channel three input terminal of the four-channel analog multiplexer 14 is responsive to a negative dc voltage (−c) produced by a negative dc voltage generator 18. A channel four input terminal of the four-channel analog multiplexer 14 is responsive to a positive dc voltage (+c) produced by a positive dc voltage generator 20. The four-channel analog multplexer 14 produces a signal $V_{OUT}$ at an output terminal thereof. The signal $V_{OUT}$ is input to a channel filter 34. An output terminal of the channel filter 34 is connected to a subsequent stage of the receiver, not shown in FIG. 9, of which the memory nonlinearity circuit 10 forms a part.

Before discussing the detailed operation of the memory nonlinearity circuit 10 it is important to recognize that the bandwidth of the communications medium between the noise impulse source and the memory-nonlinearity circuit 10 should have a much wider bandwidth than the actual communications bandwidth selected by the channel filter 34 (at least five to ten times wider). As is well known in the art, the channel filter 34 removes out-of-band Gaussian noise from the signal $V_{OUT}$. A wide bandwidth prior to the memory-nonlinearity circuit 10 ensures that the impulse maintains its distinctive time-domain shape thereby allowing the memory nonlinearity circuit 10 to detect and remove the noise impulse from the information signal.

The signal $V_{IN}$ comprises an information signal distorted by noise impulses. The signal $V_{IN}$ is delayed in the charge-coupled-device analog delay line 12 (after which the signal $V_{IN}$ is referred to as $V_D$), and the signal $V_D$ is input to the four-channel analog multiplexer 14 at the channel one and channel two input terminals. When the signal $V_{IN}$ is uncorrupted, the channel one input terminal or the channel two input terminal of the four-channel analog multiplexer 14 is connected to the output terminal thereof. As a result, the uncorrupted signal $V_D$ passes through the four-channel analog multiplexer 14 such that the signal $V_{OUT}$ is, in effect, the signal $V_D$. The signals $V_{IN}$ and $V_D$ are illustrated in the timing diagram of FIG. 11, where it can be seen that the signal $V_D$ is identical to the signal $V_{IN}$, with the signal $V_D$ lagging the signal $V_{IN}$ by $\Delta t_1$.

Figure 11:
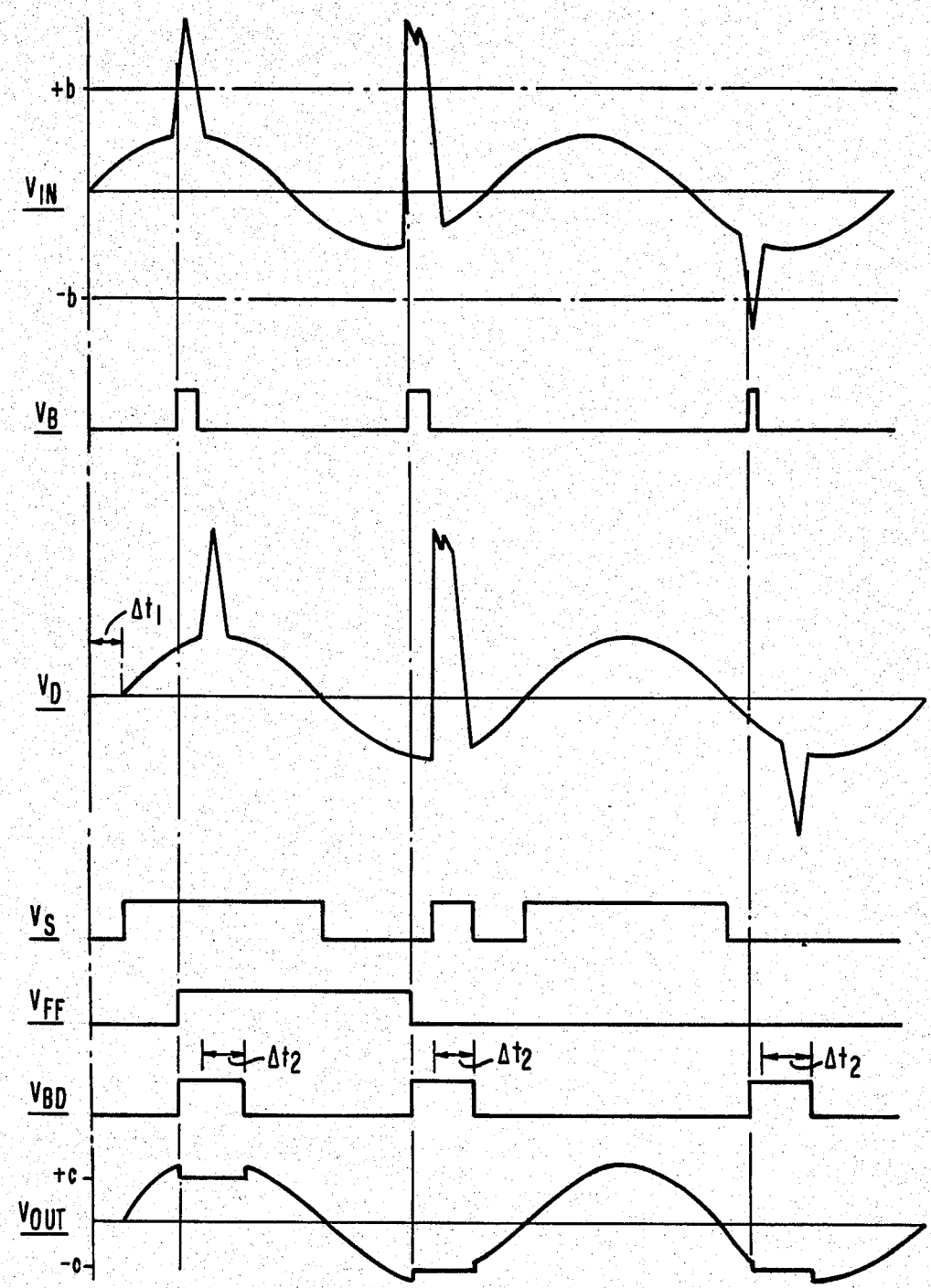
FIG. 11 is a timing diagram illustrating the operation of the memory-nonlinearity circuit of FIG. 9.

The comparators 26 and 28 determine when a noise impulse causes the signal $V_{IN}$ to exceed the threshold boundaries, $+b$ or $-b$. The comparator 26 produces an output pulse when the signal $V_{IN}$ exceeds the threshold boundary $+b$; the comparator 28 produces an output pulse, in effect, when the signal $V_{IN}$ exceeds the threshold boundary $-b$. The output signals from the comparators 26 and 28 are logically summed in the OR gate 30 to produce the signal $V_B$. The signal $V_B$ is illustrated in FIG. 11.

The signal $V_S$ from the comparator 16 indicates the sign of the signal $V_D$. The signal $V_S$ is high when the signal $V_D$ is positive, and low when the signal $V_D$ is negative. See FIG. 11 for an illustration of the signal $V_S$. The signal $V_S$ is input to the D input terminal of the D flip-flop 22, but under impulse-free conditions the D flip-flop 22 is not clocked and does not respond to the signal $V_S$.

When the signal $V_B$ goes high (because one of the threshold boundaries $\pm b$ has been exceeded), the D flip-flop 22 is clocked such that the signal $V_{FF}$ goes high if the signal $V_S$ is high (indicating the signal $V_D$ is positive), and signal $V_{FF}$ goes low if the signal $V_S$ is low (indicating the signal $V_D$ is negative). Note that the prior state of the D flip-flop 22 has no effect on the output thereof. The signal $V_{FF}$ is illustrated in the FIG. 11 timing diagram.

The delay $\Delta t_1$ imposed by the charge-coupled-device analog delay line 12 is slightly longer than the rise time of the fastest expected impulse. Therefore, the sign of the signal $V_D$ is always latched by the D flip-flop 22 just before the impulse occurs. Since only the positive-going edge of the signal $V_B$ clocks the D flip-flop 22, the sign of the signal $V_D$ prior to the noise impulse is remembered throughout the period of the impulse. This is shown by the signal $V_{FF}$ in FIG. 11.

The delayed dropout timer 32 produces a signal $V_{BD}$ in response to the signal $V_B$. The signal $V_{BD}$ goes high when the signal $V_B$ goes high, but the signal $V_{BD}$ returns to the low state $\Delta t_2$ after the signal $V_B$ goes low. Turning to the FIG. 10 truth table for the four-channel analog multiplexer 14, it can be seen that when the signal $V_{BD}$ is low, the signal $V_D$ is connected to the output terminal of the four-channel analog multiplexer 14. Whether channel one or channel two is active to supply the signal $V_D$ to the four-channel analog multiplexer 14 depends on the state of the signal $V_{FF}$ at the input terminal 23.

When the signal $V_{BD}$ is high this indicates that the signal $V_{IN}$ has exceeded one of the threshold boundaries. Under these conditions, the output terminal of the four-channel analog multiplexer 14 is connected via channel three to the negative dc voltage generator 18 or via channel four to the positive dc voltage generator 20. As can be seen from the FIG. 10 truth table, selection of the proper channel is dependent on the state of the signal $V_{FF}$ at the input terminal 23. When the signal $V_{FF}$ is low, indicating that the signal $V_{IN}$ is negative, the signal $V_{OUT}$ comprises the negative voltage estimate $-c$. The signal $V_{FF}$ goes high when the signal $V_{IN}$ is positive such that when the input terminals 23 and 33 are high the signal $V_{OUT}$ comprises the positive estimate $+c$. In this way, selection of the proper channel of the four-channel analog multiplexer 14 produces the signal $V_{OUT}$.

Note from FIG. 11 that the sign of the estimate inserted during the noise-impulse interval matches the sign of the signal $V_{IN}$ prior to corruption by the noise impulse. This is also true for the second impulse illustrated in FIG. 11, which drives the signal $V_{IN}$ in an opposite direction from the prior trajectory thereof, such that the signal $V_{IN}$ exceeds the opposite threshold boundary. Because of the charge-coupled-device analog delay line 12, the memory nonlinearity circuit 10 removes the entire impulse from the signal $V_D$ although the signal $V_B$ does not indicate the presence of an impulse until the impulse exceeds a threshold level.

It can be observed from FIG. 11 that the signal $V_{BD}$ controls the four-channel analog multiplexer 14 such that either channel three or channel four is activated even after the magnitude of the noise impulse has fallen below the threshold. This allows for the delay $\Delta t_1$ in the signal $V_D$ plus the return fall time of the longest expected impulse. A suitable setting for the delayed dropout timer 32 is $\Delta t_2$ equals $\Delta t_1$ plus the rise time or fall time of the longest expected noise impulse. When the signal $V_{BD}$ returns to the low state, thereby activating channel one or channel two of the four-channel analog multiplexer 14, the impulse has completely disappeared.

The signal $V_{OUT}$, illustrated in FIG. 11, is input to the channel filter 34. Compared to the corrupted signal $V_{IN}$, the signal $V_{OUT}$ has relatively minor perturbations where the estimates are inserted. For an ensemble of impulses occurring at random times during the signal $V_{IN}$, the estimates $\pm c$ produce the lowest possible RMS disturbance of the signal $V_{OUT}$, since these estimates where chosen at the RMS signal magnitude. The signal $V_{OUT}$ contains some energy in the passband of the channel filter 34, but much less than the prior art techniques, even the noise-blanker technique. The probability of detection errors is therefore much lower, and in fact approaches the probability of detection errors for an information signal corrupted only by Gaussian noise.

FIG. 12 illustrates another embodiment of the present invention in the form of a memory nonlinearity circuit 35. The components of FIG. 12 are identical in structure and function to the components bearing identical reference characters in FIG. 9. The various signals indicated on FIG. 12 are shown in the timing diagram of FIG. 13.

Turning to FIG. 12, there is shown a sample and hold circuit 36 that is responsive to the signal $V_D$. Recall that the signal $V_D$ lags the signal $V_{IN}$ by $\Delta t_1$. A pictorial representation of the sample and hold circuit 36 is shown in FIG. 12, wherein an input line 42 is connected between a first terminal of a switch 40 and an input terminal 46 of the sample and hold circuit 36. Although depicted mechanically, the switch 40 can be electronic. Also, a second terminal of the switch 40 is connected to an output terminal 48 via an output line 44. A capacitor 38 is connected from the output line 44 to ground. Any type of storage device can replace the capacitor 38. A control terminal 50 of the sample and hold circuit 36 is responsive to the signal $V_{BD}$.

In operation, when the signal $V_{BD}$ is low the switch 40 is closed such that the input terminal 46 is connected to the output terminal 48. In this configuration, the signal $V_{OUT}$ comprises the signal $V_D$. When the signal $V_{BD}$ goes high, indicating that a noise impulse has occurred in the signal $V_{IN}$, the switch 40 opens. The capacitor 38, which was previously charged to the value of the signal $V_D$ before the impulse, now discharges through the output line 44 and the output terminal 48. In essence, the capacitor 38 serves as a "memory"; during the impulse, the signal $V_{OUT}$ comprises the value of the signal $V_D$ immediately prior to the noise impulse, as stored by the capacitor 38.

Figure 13:
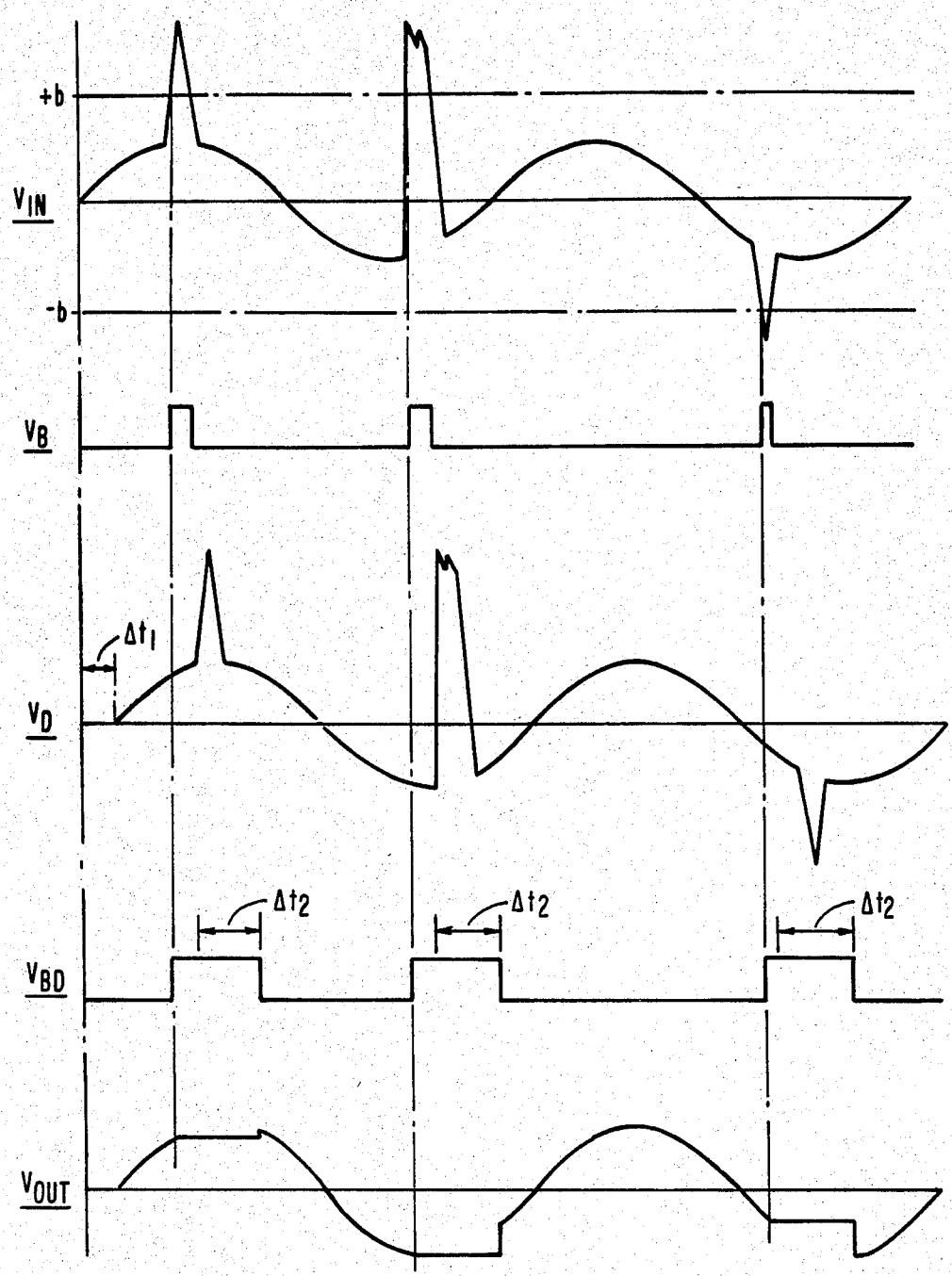
FIG. 13 is a timing diagram illustrating the operation of the memory-nonlinearity circuit of FIG. 12.

The function of the sample and hold circuit 36 is more clearly illustrated in the timing diagram of FIG. 13. Note that the signal $V_{BD}$ goes high when the signal $V_{IN}$ exceeds one of the thresholds ±b. At the leading edge of the signal $V_{BD}$, the signal $V_{OUT}$ is held constant at the value thereof immediately prior to the leading edge of the signal $V_{BD}$. Note that when an impulse drives the signal $V_{IN}$ into the region of opposite sign, the memory nonlinearity circuit 35 inserts an estimate of the correct sign. Discontinuities in the signal $V_{OUT}$ are smoothed by the channel filter 34 as previously discussed.

Comparing the timing diagrams of FIGS. 11 and 13, note that the embodiment of FIG. 12 provides a slight improvement over the embodiment of FIG. 9. That is, the signal $V_{OUT}$ of FIG. 13 more nearly resembles an uncorrupted information signal than the information signal illustrated in FIG. 11. In part, this is due to the particular examples illustrated in the timing diagrams of FIGS. 11 and 13. If an impulse occurs near a zero-crossing of the signal $V_{IN}$, the embodiment of FIG. 9 produces a considerable and incorrect jump in the signal $V_{OUT}$. In contrast, the embodiment of FIG. 12 inserts a more nearly correct, near-zero value.

Figure 14:
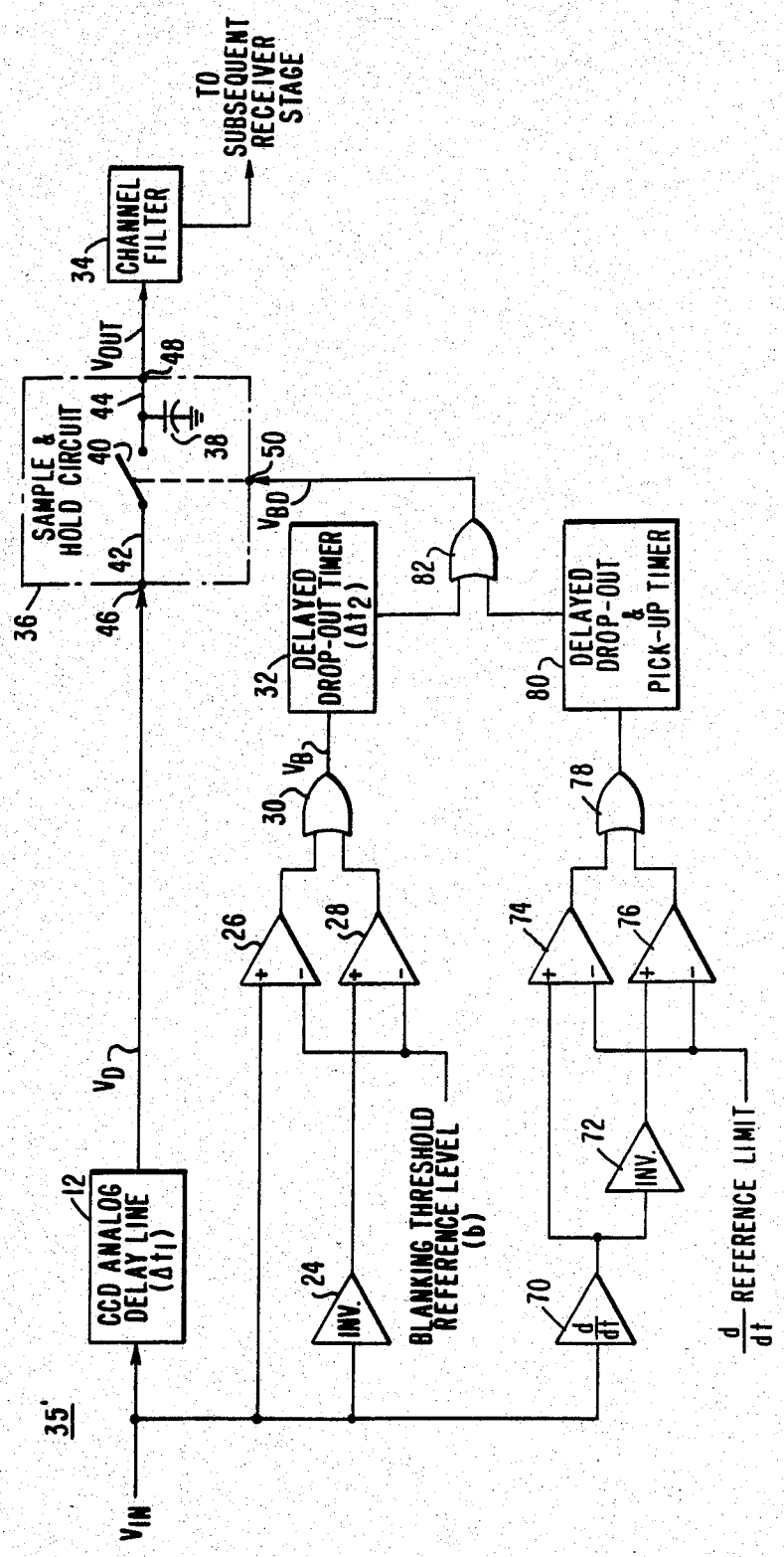
FIG. 14 is a partial block diagram and partial schematic of a third embodiment of the memory-nonlinearity circuit of the present invention.

Consider the problem of noise impulses that distort the information signal, but do not exceed a threshold boundary. A memory-nonlinearity circuit 35' illustrated in FIG. 14 provides blanking of the information signal when corrupted by noise impulses that do not exceed the predetermined blanking threshold reference levels (±b) because the noise impulses drive the sign of the information signal in the opposite direction. For example, a negative-going noise impulse occurring at a positive peak of the information signal may not exceed the negative threshold boundary and therefore no blanking occurs. The memory nonlinearity circuit 35' of FIG. 14 is intended to overcome this problem. The components of FIG. 14 are identical in structure and function to the components bearing identical reference characters in FIG. 12.

An input terminal of a differentiator 70 is responsive to the signal $V_{IN}$. An output terminal of the differentiator 70 is connected to an input terminal of an inverter 72 and to a non-inverting input terminal of a comparator 74. A non-inverting input terminal of a comparator 76 is connected to an output terminal of the inverter 72. An inverting input terminal of the comparators 74 and 76 is responsive to a first derivative reference limit. A first input terminal of an OR gate 78 is connected to an output terminal of the comparator 74; a second input terminal of the OR gate 78 is connected to an output terminal of the comparator 76. An output terminal of the OR gate 78 is connected to an input terminal of a delayed drop-out and pick-up timer 80. A first input terminal of an OR gate 82 is connected to an output terminal of the delayed drop-out timer 32. A second input terminal of the OR gate 82 is connected to an output terminal of the delayed drop-out and pick-up timer 80. The signal $V_{BD}$ is produced at an output terminal of the OR gate 82 and input to the sample and hold circuit 36 at the control terminal 50 thereof.

The purpose of the components added in the embodiment of FIG. 14 is to detect a rate of change in the signal $V_{IN}$ that is too large for too long. The signal $V_{IN}$ is differentiated in the differentiator 70, and in parallel branches, one of which incorporates an inversion, the differentiator signal is compared with a differential reference limit in the comparators 74 and 76. The signal at the output terminal of the OR gate 78 goes to a high state when the derivative of the signal $V_{IN}$ exceeds the first derivative reference limit. That is, the signal at the output terminal of the OR gate 78 goes high when the rate of change of the signal $V_{IN}$ is too large. The delayed drop-out and pick-up timer goes to a high state a predetermined time after the signal input thereto goes high. This feature of the delayed drop-out and pick-up timer 80 provides the test for determining when the first derivative of the signal $V_{IN}$ exceeds the first derivative reference limit for an excessive period.

When the output signal from the delayed drop-out timer 32 goes high, indicating that the signal $V_{IN}$ has exceeded a blanking threshold (±b), or the signal from the delayed drop-out and pick-up timer 80 goes high, indicating that the rate of change of the signal $V_{IN}$ has exceeded the first derivative reference limit for a predetermined time, the output signal at the output terminal of the OR gate 82 goes high. The signal at the output terminal of the OR gate 82 is designated $V_{BD}$ in FIG. 14. As discussed in the embodiment of FIG. 12, when the signal $V_{BD}$ goes to a high state the signal $V_D$ is blanked and a constant-value estimate is used to form the signal $V_{OUT}$.

It is possible to carry the memory notion associated with the present invention much further. It can be shown that with knowledge of the information signal waveform prior to corruption by the noise impulse, it is possible to adjust the magnitude and sign of the estimate. Consider the Taylor-series expansion of the signal (function) at time $t_o$ just prior to the occurrence of an impulse:

$$f(t_o + \Delta t) = f(t_o) + \Delta t f'(t_o) + \frac{(\Delta t)^2}{2!} f''(t_o) + \frac{(\Delta t)^3}{3!} f'''(t_o) + \ldots$$

If the impulse has perturbed the signal at some time between $t_o$ and $(t_o+\Delta t)$, the above function can be used to estimate the signal at time $(t_o+\Delta t)$. For practical circuit implementation the Taylor-series expansion can be truncated after two or three terms, because the marginal improvement with additional terms and errors due to Gaussian noise renders the additional complexity of little value.

Figure 15:
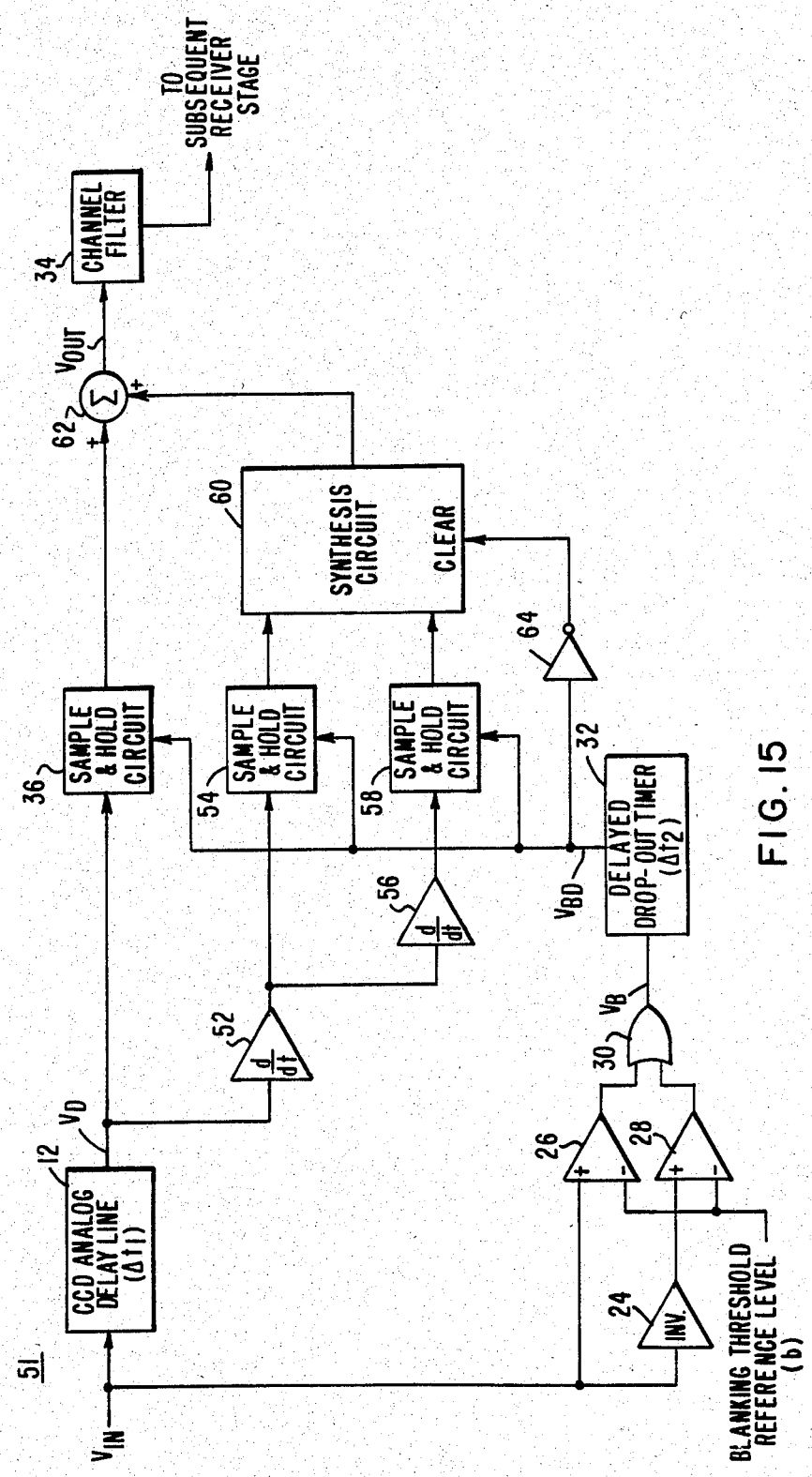
FIG. 15 is a partial block diagram and partial schematic of a fourth embodiment of the memory-nonlinearity circuit of the present invention.

An embodiment of the present invention incorporating the derivative notions discussed above, is illustrated in FIG. 15. Illustrated therein is a memory nonlinearity circuit 51. The components of FIG. 15 are identical in structure and function to the components bearing identical reference characters in FIG. 12. When the information signal is corrupted by a noise impulse, the memory nonlinearity circuit 51 produces an estimate based on the derivatives of the information signal prior to corruption by the noise impulse, and uses these derivatives to formulate estimates that are incorporated into the composite signal during the blanking interval.

The signal $V_D$ is input to a differentiator 52 in FIG. 15. An output terminal of the differentiator 52 is connected to a data input terminal of a sample and hold circuit 54 and to an input terminal of a differentiator 56. An output terminal of the differentiator 56 is connected to a data input terminal of a sample and hold circuit 58. A control input terminal of the sample and hold circuit 54 and a control input terminal of the sample and hold circuit 58 are responsive to the signal $V_{BD}$. The signal $V_{BD}$ is input to an inverting gate 64; and output terminal of the inverting gate 64 is input to a clear input terminal of a synthesis circuit 60. An output terminal of the sample and hold circuit 54 and an output terminal of the sample and hold circuit 58 are connected, respectively, to first and second data input terminals of the synthesis circuit 60. An output terminal of the synthesis circuit 60 is connected to a first input terminal of a summer 62. A second input terminal of the summer 62 is connected to an output terminal of the sample and hold circuit 36.

When the signal $V_{BD}$ goes high, the first derivative of the signal $V_D$ is latched in the sample and hold circuit 54 and the second derivative of the signal $V_D$ is latched in the sample and hold circuit 58. The synthesis circuit 60 could include a capacitor (not shown in FIG. 15) having a voltage that is ramped up or down by a controlled-current charging source (not shown in FIG. 15). The rate of charging the capacitor is responsive to the rate of change of the signal $V_D$ latched in the sample and hold circuit 54, i.e., the first derivative of the signal $V_D$. The second derivative value latched in the sample and hold circuit 58 ramps up or down the charging rate of the capacitor. The capacitor charging provides sealing by the variables $\Delta t$ and $(\Delta t)^2/2!$. During the noise impulse the summer 62 produces the signal $V_{OUT}$ by adding the voltage across the capacitor of the synthesis circuit 60 to the signal value sampled in the sample and hold circuit 36. The signal $V_{OUT}$ comprises the delayed signal $V_D$ when a noise impulse is not present. When the noise impulse corrupts the information signal the signal, $V_{OUT}$ comprises an estimate of the future trajectory of the signal $V_D$, using the first and second derivatives. When the signal $V_{BD}$ is in the low state, indicating that a noise impulse is not present, the capacitor remains in a discharged state due to the action of the inverting gate 64.

Despite the enhanced accuracy of the embodiment of the present invention incorporating the derivative notions discussed above, this technique does in fact present possible problems. For example, FIG. 16 shows the signal $V_{IN}$ and various estimates therefore assuming that a noise impulse has corrupted the signal $V_{IN}$ at a time $t_a$. The vector labeled $E_0$ illustrates the trajectory of the estimate if a constant-estimate technique, such as the embodiment of FIG. 9, is used. If the signal value plus only the first derivative is used to provide the estimate, the trajectory follows the vector designated $E_1$. The trajectory $E_1$ diverges quickly from the wave shape of the signal $V_{IN}$ and passes through the blanking threshold $+b$ if the impulse lasts for more than a fraction of a sampling period. If the signal value plus the first and second derivatives are used to estimate the trajectory, the estimate follows the expected waveform for a longer time, but ultimately also exceeds the threshold $-b$. These problems may be effectively eliminated by simply cutting-off the action of the derivative-estimating circuitry a predetermined maximum safe time after inception of the noise impulse, or by clipping the estimated signal value at the threshold limits.

Another concern is the response of the memory nonlinearity circuit 51 to Gaussian noise. In a typical communcations receiver employing the memory nonlinearity circuit 51, the pass-band filtering operation is accomplished in stages following the memory nolinearity circuit 51. Therefore, Gaussian noise has not been removed from the signal $V_{IN}$. Recall that the Gaussian noise has a wide bandwidth and therefore produces waveform perturbations at a high rate compared to the maximum rate-of-change of the signal $V_{IN}$. FIG. 17 illustrates the signal $V_{IN}$ with Gaussian noise interference. Derivative-type estimating circuits are seriously affected by the Gaussian noise and may produce grossly improper estimates. The vector $E'_0$ illustrates the estimate substituted for the signal $V_{IN}$ assuming a noise impulse has occurred at time $t'_a$. An estimating circuit employing the signal value plus the first derivative would produce a trajectory indicated by a vector $E'_1$. Note that the vector $E'_1$ quickly passes through the threshold boundary $+b$. If the signal value plus the first and second derivatives are used to estimate the future trajectory, the estimate follows a vector $E'_2$ illustrated in FIG. 17. Here also, the vector $E'_2$ quickly exceeds the boundary threshold $-b$.

To avoid the estimate errors caused by Gaussian noise, the signal-to-Gaussian noise ratio must be very high for the memory-nonlinearity circuit 51 to function properly. Alternatively, a band-limiting filter can be placed ahead of the derivative circuits to mitigate the effects of all but narrow-band Gaussian noise. For the filter to function properly the noise impulses must be sufficiently infrequent so the response of the filter to a given impulse has completely damped out before the derivative must be latched for the next estimating interval. This damping time can, in turn, be reduced by inserting a simple nonlinearity such as the prior art clippers previously discussed, ahead of the band-limiting filter.

Figure 18:
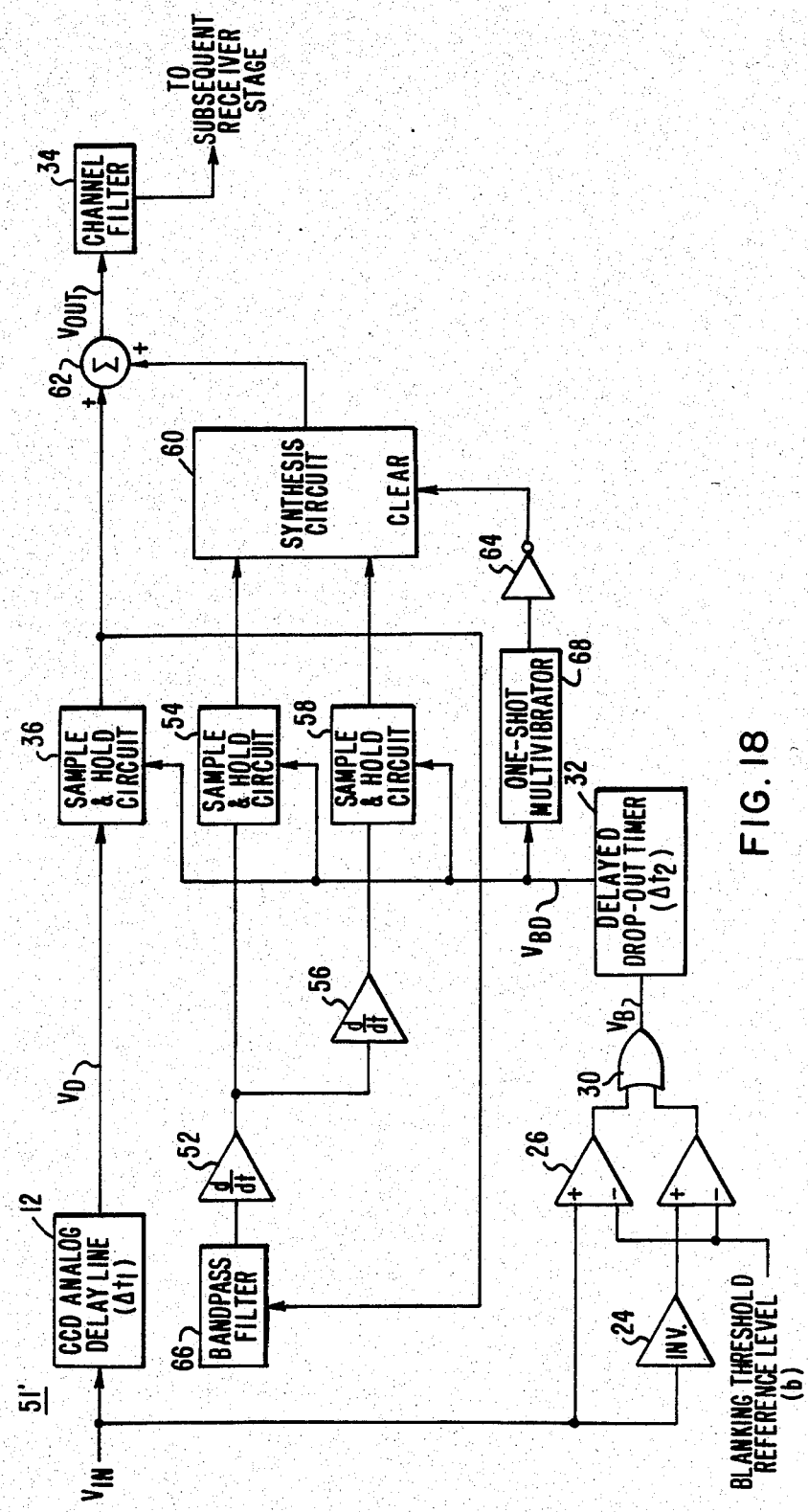
FIG. 18 is a partial block diagram and partial schematic of a fifth embodiment of the memory-nonlinearity circuit of the present invention.

A memory nonlinearity circut 51' illustrated in FIG. 18 incorporates means for overcoming the problems associated with the derivative estimating circuitry discussed above. The components of FIG. 18 are identical in structure and function to the components bearing identical reference characters in FIG. 15.

A one-shot multivibrator 68 is disposed between the delayed drop-out timer 32 and the inverting gate 64 in FIG. 18. That is, the one-shot multivibrator 68 is responsive to the signal $V_{BD}$; an output terminal of the one-shot multivibrator 68 is connected to an input terminal of the inverting gate 64. When the signal $V_{BD}$ goes to a high state, the output terminal of the one-shot multivibrator 68 also goes high. The output terminal of the one-shot multivibrator 68, however, remains in the high state for only a predetermined time. When the output terminal of the one-shot multivibrator 68 goes low, the synthesis circuit 60 is cleared such that only the latched value from the sample and hold circuit 36 is used to form the signal $V_{OUT}$. By clearing the synthesis circuit 60, the one-shot multivibrator 68 effectively cuts off the action of the sample and hold circuits 54 and 58.

Also, in FIG. 18, the output terminal of the sample and hold circuit 36 is connected to an input terminal of a bandpass filter 66. An output terminal of the bandpass filter 66 is connected to the input terminal of the differentiator 52. Note that in this configuration the differentiator 52 is not responsive to the signal $V_D$. The bandpass filter 66 filters Gaussian noise from the delayed signal $V_D$ when the latter is not latched by the sample and hold circuit 36. Connection of the bandpass filter 66 to the output terminal of the sample and hold circuit 36 eliminates the disturbance to the bandpass filter 66 during a noise impulse so that the interval needed for recovery of the bandpass filter 66 is minimal.

It is probably easiest to implement the memory nolinearity circuit 51' of FIG. 18 by using a new monolithic signal-processing circuit that samples and digitizes the input signal, processes the samples according to a user-programmed algorithm, and converts back to an analog signal. This chip, available from Intel Corporation of Santa Clara, CA works for frequencies up to five to ten kHz. For substantially wider communication band-widths, special hardware design is necessary.

Figure 19:
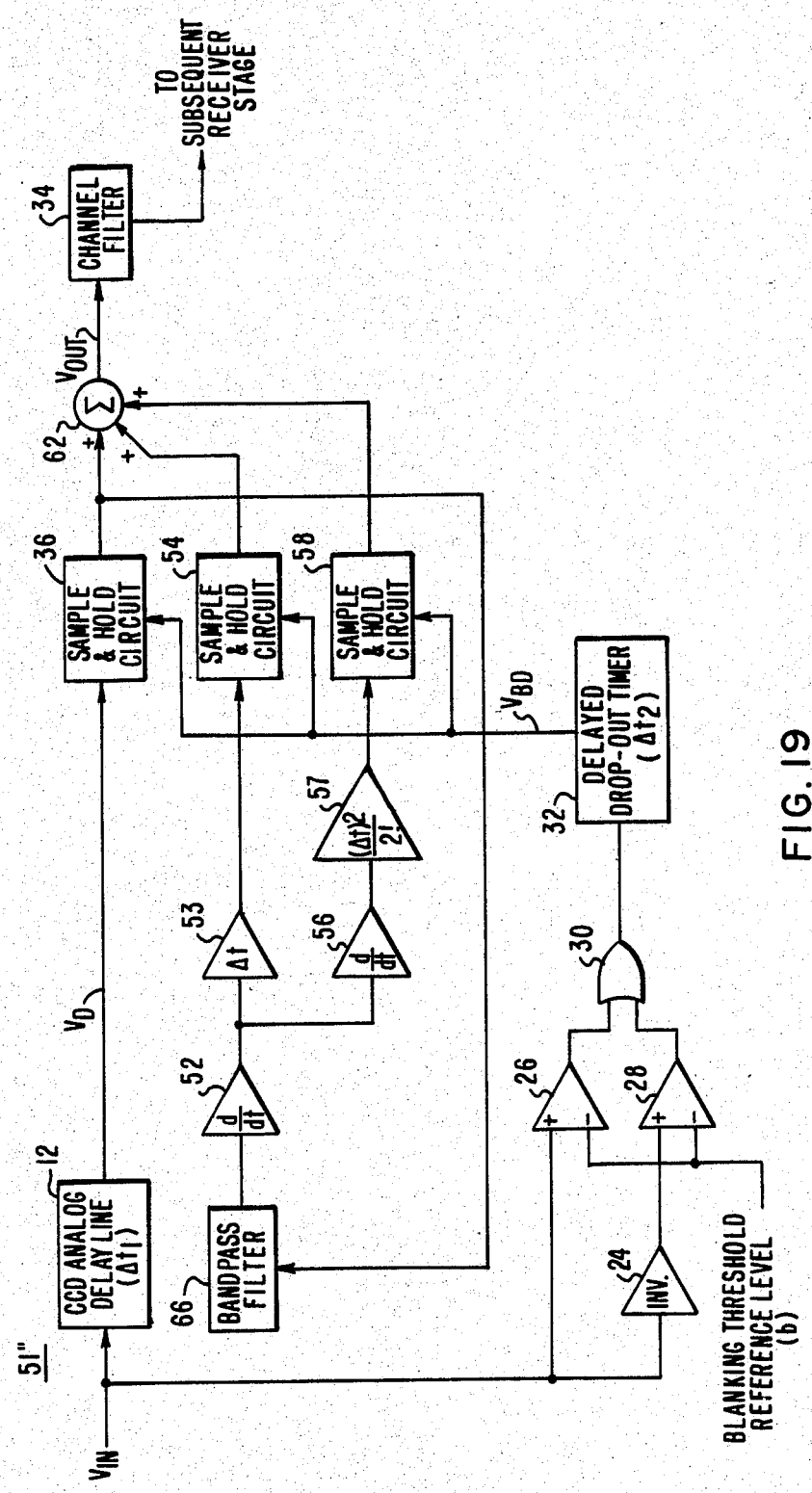
FIG. 19 is a partial block diagram and partial schematic of a sixth embodiment of the memory-nonlinearity circuit of the present invention.

FIG. 19 illustrates a third embodiment of the memory non-linearity circuit 51 of FIG. 14 and is accordingly designated the memory non-linearity circuit 51''. The components of FIG. 19 are identical in structure and function to the components bearing identical reference characters in FIG. 15. If it is assumed that the noise impulses corrupting the signal $V_{IN}$ are of relatively predictable and constant duration, simplifications can be made in the embodiment of FIG. 15. That is the factor $\Delta t$ can be fixed at a value slightly larger than the maximum expected rise time of a noise impulse, such that $\Delta t$ and $(\Delta t)^2/2!$ in the Taylor-series expansion expression are constants. These assumptions are valid if the noise impulses originate from a well-defined noise source such as relay coil interruptions in a telephone exchange, automobile ignition noise, or electric power corona discharge.

The embodiment of FIG. 19 substantially reduces the mean error of estimation by eliminating the synthesis circuit 60 and instead multiplying the value of the first derivative latched by the sample and hold circuit 54 by the constant $\Delta t$, where $\Delta t$ is the mean blanking period or the impulse duration, and adding the product to the fixed estimate latched by the sample and hold circuit 36. The first derivative estimate now aligns with the actual signal at the middle of the blanking interval if the rate-of-change of the noise impulse is fairly constant. Additionally, the product of the second derivative and the constant $(\Delta t)^2/2!$ can be added to the sum of the constant estimate and the first derivative, to provide a more accurate estimate. This second derivative factor is especially helpful near positive or negative peaks of the noise impulse where the first derivative is changing rapidly. Note that the initial assumptions made regarding the embodiment of FIG. 19 allow for elimination of the synthesis circuit 60, the one-shot multivibrator 68, and the inverting gate 64 from the memory-nonlinearity circuit 51' of FIG. 15. The one-shot multivibrator 68 has been eliminated because the first and second derivative estimates are fixed in the embodiment of FIG. 19 and therefore cannot run away during long noise impulses.

Figure 20:
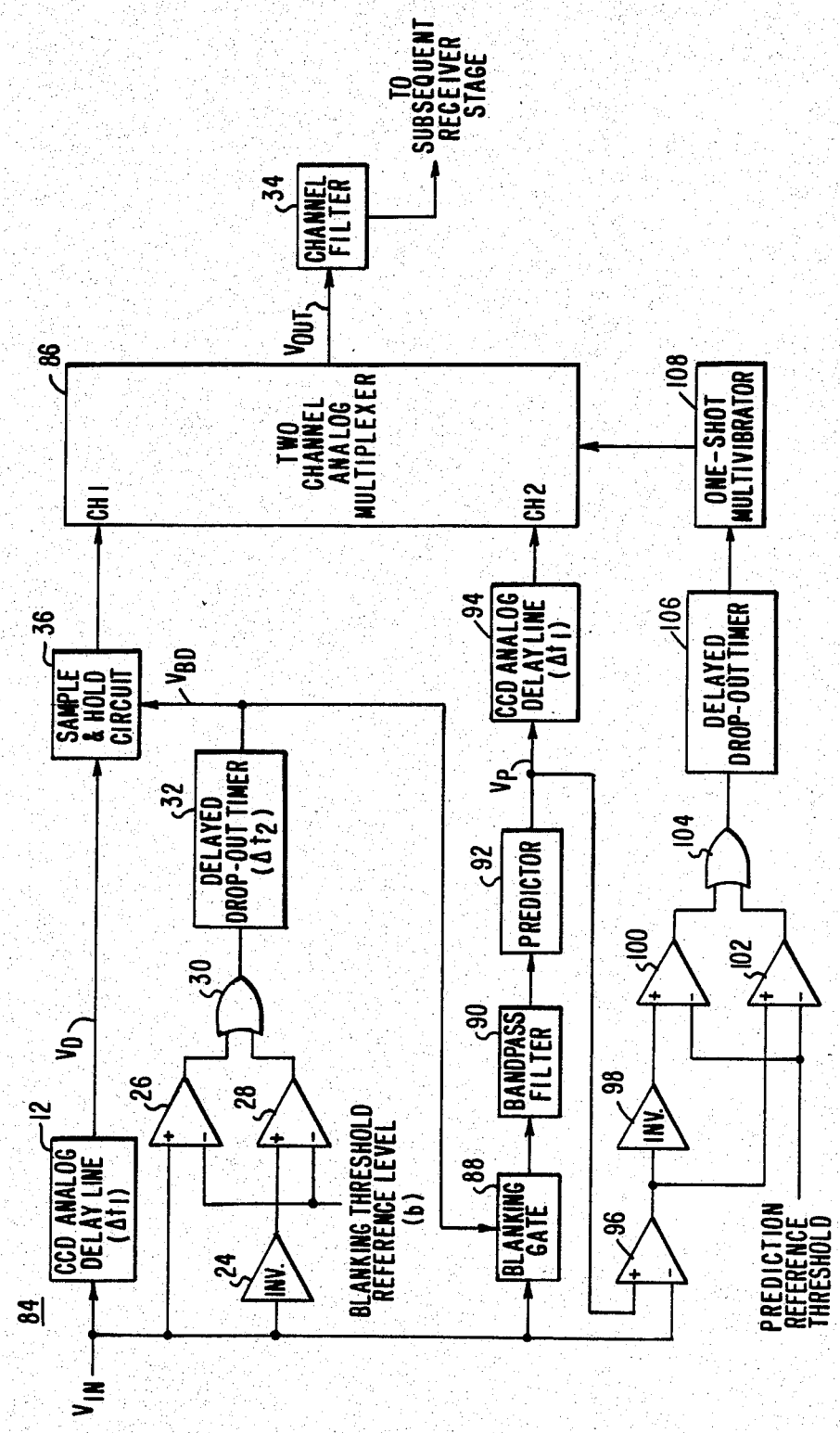
FIG. 20 is a partial block diagram and a partial schematic of a seventh embodiment of the memory-nonlinearity circuit of the present invention.

Illustrated in FIG. 20 is a noise blanker and predictor circuit 84 that uses a predictor 92 to produce an estimate of the signal $V_{IN}$ during the noise impulse. It should be noted that the charge-coupled-device analog delay line 12, the sample and hold circuit 36, the inverter 24, the comparators 26 and 28, the OR gate 30, and the delayed drop-out timer 32 function in a manner identical to that described in conjunction with the memory-nonlinearity circuit 10 illustrated in FIG. 9. The sample and hold circuit 36 provides a signal estimate for a burst of impulses or a long, high-amplitude spike; the predictor 92, which provides a more accurate estimate, is activated during infrequent impulses.

The signal $V_{IN}$ is input to a blanking gate 88 at a data input terminal thereof; a control input terminal of the blanking gate 88 is responsive to the signal $V_{BD}$ produced by the delayed drop-out timer 32. An output terminal of the blanking gate 88 is connected to an input terminal of a bandpass filter 90. An output terminal of the bandpass filter 90 is connected to an input terminal of the predictor 92. The predictor 92 produces a signal $V_P$ that is input to an input terminal of a charge-coupled-device analog delay line 94. The output terminal of the sample and hold circuit 36 is connected to a channel one input terminal of a two-channel analog multiplexer 86. An output terminal of the charge-coupled-device analog delay line 94 is connected to a channel two input terminal of the two-channel analog multiplexer 86.

When the signal $V_{BD}$ is in a low state the blanking gate 88 permits the signal $V_{IN}$ to pass therethrough to the bandpass filter 90. When the signal $V_{BD}$ is high, indicating that a noise impulse has corrupted the signal $V_{IN}$, the blanking gate 88 blocks the signal $V_{IN}$ from passing to the bandpass filter 90. The predictor 92 predicts the future trajectory of the signal $V_{IN}$ by using prior signal values and derivatives thereof, as discussed in conjunction with the memory-nonlinearity circuit 51 illustrated in FIG. 15, or using any of the well-known linear predictor methods. The bandpass filter 90 filters Gaussian noise from the signal $V_{IN}$ during no-impulse conditions so that the predictor 92 has a relatively clean signal to use in predicting the future trajectory. Also, the bandpass filter 90 reduces the recovery time of the predictor 92 after an impulse. The purpose of the blanking gate 88 is to minimize recovery time of the bandpass filter 90 and the predictor 92. The anticipation or lead time of the predictor 92 equals the delay time of the bandpass filter 90 so the signal $V_P$ may be compared to the signal $V_{IN}$. The charge-coupled-device analog delay line 94 imposes a delay of $\Delta t_1$ in the signal $V_P$; this is the same delay imposed by the charge-coupled-device analog delay line 12. These delay times must be equal to ensure proper recombination of the signals at the channel one and channel two input terminals of the two-channel analog multiplexer 86. Note that the signal $V_P$ is free of impulse interruption and out-of-band Gaussian noise at the time of impulse inception.

The signal $V_P$ is input to a non-inverting input terminal of a summing amplifier 96; the signal $V_{IN}$ is input to an inverting input terminal thereof. An output terminal of the summing amplifier 96 is connected to an input terminal of an inverter 98. An output terminal of the inverter 98 is connected to a non-inverting input terminal of a comparator 100. The output terminal of the summing amplifier 96 is also connected to a non-inverting input terminal of a comparator 102. A prediction reference threshold is input to an inverting input terminal of the comparator 100 and an inverting input terminal of the comparator 102. An output terminal of the comparator 100 is connected to a first input terminal of an OR gate 104; a second input terminal of the OR gate 104 is connected to an output terminal of the comparator 102. An output terminal of the OR gate 104 is connected to an input terminal of a delayed drop-out timer 106. An output terminal of the delayed drop-out timer 106 is connected to an input terminal of a one-shot multivibrator 108. An output terminal of the one-shot multivibrator 108 is connected to a data input terminal on the two-channel analog multiplexer 86. The signal $V_{OUT}$ is produced at an output terminal of the two-channel analog multiplier 86 and input to the channel filter 34 as previously discussed.

In the summing amplifier 96 a signal representing the difference between the signals $V_{IN}$ and signal $V_P$ is produced. In the comparators 100 and 102 the signal from the summing amplifier 96 is compared with the prediction reference threshold to determine whether the signal from the summing amplifier 96 is in excess thereof. The output terminal of the comparators 100 and 102 goes to a high state when the error between the signal $V_P$ and $V_{IN}$ exceeds the prediction reference threshold, thus indicating disruption of $V_{IN}$ by an impulse or burst of impulses. The delayed drop-out timer 106 goes high when the output terminal of the comparator 100 or the comparator 102 goes high. When the delayed drop-out timer 106 goes high, the output terminal of the one-shot multivibrator 108 also goes high. The data input terminal of the two-channel analog multiplexer 86 is responsive to the high state at the output terminal of the one-shot multivibrator 108 such that channel two of the two-channel analog multiplexer 86 is activated. Under these conditions, the signal $V_P$, after delay by the charge-coupled-device analog delay line 94, constitutes the signal $V_{OUT}$ from the two-channel analog multiplexer 86.

If the output terminals of the comparators 100 and 102 are low, thereby indicating that it is unnecessary to use the signal $V_P$, the output terminal of the OR gate 104 is low. Therefore, the output terminal of the delayed drop-out timer 106 and the output terminal of the one-shot multivibrator 108 are also in a low state and channel one of the two-channel analog multiplexer 86 is active. Depending on the state of the signal $V_{BD}$, which is input to the sample and hold circuit 36, when channel one of the two-channel analog multiplexer 86 is activated the signal $V_{OUT}$ consists of either the uncorrupted signal $V_D$ or a constant value representing the magnitude of the signal $V_D$ before corruption by a noise impulse.

The delayed drop-out timer 106 and the one-shot multivibrator 108 limit the time channel two is active to the anticipation interval of the predictor 92, because after that time the predictor 92 is affected by noise impulses causing the predictor 84 to lock-up in the state where channel two is active. Note the delayed drop-out timer 106 stays high for the duration of the impulse. The one-shot multivibrator 108, which goes low a predetermined time after triggered high, irrespective of the state of the input thereto, deactivates channel two when in the low state. If the predetermined time equals the anticipation interval of the predictor 92, any portion of the signal $V_P$ corrupted by noise is not used to form the signal $V_{OUT}$.

Because of the need for the bandpass filter 90 and the predictor 92 to operate in the steady state prior to a noise impulse, the noise blanker and predictor circuit 84 works most efficiently when the time between noise impulses exceeds the recovery time of the predictor 92. If this condition is met, substitution of a predicted value, by activating channel two, should be very smooth. The dual means of providing an estimate value, via the sample and hold circuit 36 or the predictor 92, allows the noise blanker and predictor circuit 84 to effectively process the signal $V_{IN}$ when corrupted by a burst of closely-spaced impulses or by sporadic high-magnitude impulses with a relatively long time between successive impulses. For the latter case the more precise estimate provided by the predictor 92 is used; for impulse bursts the sample and hold circuit 36 provided a better estimate.

What is claimed is:

1. A memory nonlinear noise-blanking circuit responsive to a composite signal including an information signal distorted by a noise signal, said memory nonlinear noise blanking circuit comprising:
   delay means responsive to the composite signal for producing a delayed signal;
   means for producing a first reference signal;
   threshold detector means including:
   first comparator means having an inverting input terminal responsive to the first reference signal and a non-inverting input terminal responsive to the composite signal, for producing a first comparison signal;
   inverter means responsive to the composite signal for producing an inverted signal;
   second comparator means having an inverting input terminal responsive to the first reference signal and a non-inverting input terminal responsive to the inverted signal, for producing a second comparison signal;
   and first gate means having a first input terminal responsive to said first comparison signal and a second input terminal responsive to said second comparison signal, for producing a threshold signal at an output terminal thereof, said threshold signal rendered in a first state in response to one set of conditions of said first and second comparison signals and in a second state in response to another set of conditions of said first and second comparison signals;
   timer means responsive to said threshold signal for producing a timing signal, wherein said timing signal is in a first state when said threshold signal is in said first state, and wherein said timing signal changes to a second state a predetermined time after said threshold signal changes to said second state;
   signal generator means for producing an approximation signal selected to approximate the value of the information signal while said timer means is in said first state;
   and second gate means responsive to said delayed, timing, and approximation signals for producing an output signal at an output terminal thereof, wherein said output signal represents said approximation signal when said timing signal is in said first state, and represents said delayed signal when said timing signal is in said second state.

2. The memory nonlinear noise-blanking circuit of claim 1 wherein the information signal is a digital signal.

3. The memory nonlinear noise-blanking circuit of claim 1 wherein the information signal is an analog signal.

4. The memory nonlinear noise-blanking circuit of claim 1 wherein the delay means is an analog delay line having a delay time of $\Delta t_1$, and wherein $\Delta t_1$ is a longer than the duration of the noise signal.

5. The memory nonlinear noise-blanking circuit of claim 4 wherein the analog delay line includes a charge-coupled device.

6. The memory nonlinear noise-blanking circuit of claim 1 wherein the magnitude of the first reference signal is greater than the magnitude of the information signal, and wherein the magnitude of the first reference signal is exceeded by the composite signal.

7. The memory nonlinear noise-blanking circuit of claim 1 wherein the predetermined time is equal to $\Delta t_1$ plus the rise time of the noise signal.

8. The memory nonlinear noise-blanking circuit of claim 1 including:
  sign-detector means responsive to the delayed signal for producing a flip-flop signal having a first state when the delayed signal is positive and having a second state when the delayed signal is negative;
  negative dc voltage generator means for producing a negative dc signal, wherein the signal generator means is responsive to said negative dc signal;
  positive dc voltage generator means for producing a positive dc signal, wherein the signal generator means is responsive to said positive dc signal;
  and wherein the approximation signal comprises said positive dc signal when said flip-flop signal is in said first state and wherein the approximation signal comprises said negative dc signal when said flip-flop signal is in said second state.

9. The memory nonlinear noiseblanking circuit of claim 8 wherein the sign detector means includes means for producing a second reference signal;
  comparator means having an inverting input terminal responsive to said second reference signal and a non-inverting input terminal responsive to the delayed signal, for producing a comparison signal, said comparison signal having a first state when the delayed signal exceeds said second reference signal and having a second state when said second reference signal exceeds said delayed signal;
  and D-type flip-flop means having a D-input terminal responsive to said comparison signal and a clock input terminal responsive to the threshold signal, for producing the flip-flop signal, wherein the flip-flop signal is triggered to the first state when the threshold signal and said comparison signal are in the first state, and wherein said flip-flop signal is triggered to the second state when the threshold signal is in the first state and said comparison signal is in the second state, wherein the signal generator means is responsive to said flip-flop signal.

10. The memory nonlinear noise-blanking circuit of claim 1 including:
  means for producing a second reference signal;
  comparator means having an inverting input terminal responsive to said second reference signal and a non-inverting input terminal responsive to the delayed signal, for producing a comparison signal, said comparison signal having a first state when the delayed signal exceeds said second reference signal and having a second state when said second reference signal exceeds said delayed signal;
  D-type flip-flop means having a D input terminal responsive to said comparison signal and a clock input terminal responsive to the threshold signal, for producing a flip-flop signal, said flip-flop signal triggered to a first state when the threshold signal and said comparison signal are in the first state, and said flip-flop signal triggered to a second state when the threshold signal is in the first state and said comparison signal is in said second state;
  wherein the signal generator means includes a negative dc voltage generator means for producing a negative dc signal, and a positive dc voltage generator means for producing a positive dc signal;
  and wherein the gate means includes a three-channel analog multiplexer having a first control terminal responsive to said flip-flop signal, a second control terminal responsive to the timing signal, a first data input terminal responsive to the delayed signal, a second data input terminal responsive to said negative dc signal, and a third data input terminal responsive to said positive dc signal, for producing the output signal, wherein the output signal comprises the delayed signal when said flip-flop signal is in the second state and the timing signal is in the second state, and wherein the output signal comprises the delayed signal when said flip-flop signal is in the first state and the timing signal is in the second state, and wherein the output signal comprises said negative dc signal when said flip-flop signal is in the second state and the timing signal is in the first state, and wherein the output signal comprises said positive dc signal when said flip-flop signal is in the first state and the timing signal is in the first state.

11. A memory nonlinear noise-blanking circuit responsive to a composite signal including an information signal distorted by a noise signal, said memory nonlinear noise-blanking circuit comprising:
  delay means responsive to the composite signal for producing a delayed signal;
  means for producing a first reference signal;
  threshold detector means including:
  first comparator means having an inverting input terminal responsive to the first reference signal and a non-inverting input terminal responsive to the composite signal, for producing a first comparison signal;
  first inverter means responsive to the composite signal for producing a first inverted signal;
  second comparator means having an inverting input terminal responsive to the first reference signal and a non-inverting input terminal responsive to the inverted signal, for producing a second comparison signal;
  and first OR gate means responsive to said first and said second comparison signals, for producing a threshold signal at an output terminal thereof, said threshold signal rendered in a first state in response to one set of conditions of said first and second comparison signals and in a second state in response to another set of conditions of said first and second comparison signals;
  first timer means responsive to said threshold signal for producing a first timing signal, wherein said first timing signal is in a first state when said threshold signal is in said first state, and wherein said first timing signal changes to a second state a first predetermined time after said threshold signal changes to said second state;

and sample and hold means having a data input terminal responsive to said delayed signal and a control input terminal responsive to said first timing signal, for producing a sampled signal at an output terminal thereof, wherein while said timing signal is in said first state said sampled signal is held constant at a value representing the value of said delayed signal when said timing signal changed to said first state, and wherein while said timing signal is in said second state said sampled signal is representative of said delayed signal.

12. The memory nonlinear noise-blanking circuit of claim 11 wherein the information signal is a digital signal.

13. The memory nonlinear noise-blanking circuit of claim 11 wherein the information signal is an analog signal.

14. The memory nonlinear noise-blanking circuit of claim 11 wherein the delay means is an analog delay line having a delay time of $\Delta t_1$, and wherein $\Delta t_1$ is longer than the duration of the noise signal.

15. The memory nonlinear noise-blanking circuit of claim 11 wherein the analog delay line includes a charge-coupled device.

16. The memory nonlinear noise-blanking circuit of claim 11 wherein the magnitude of the first reference signal is greater than the magnitude of the information signal, and wherein the magnitude of the first reference signal is exceeded by the composite signal.

17. The memory nonlinear noise-blanking circuit of claim 11 wherein the threshold detector means includes:
means for producing a derivative reference signal;
derivative threshold means for producing a derivative threshold signal having a first state when the composite signal exceeds the derivative reference signal and having a second state when the composite signal does not exceed the derivative reference signal;
second timer means responsive to said derivative threshold signal for producing a second timing signal, wherein said second timing signal changes to a first state a second predetermined time after said derivative threshold signal changes to said first state, and wherein said second timing signal changes to a second state a third predetermined time after said derivative threshold signal changes to said second state;
and second OR gate means disposed between the first timer means and the sample and hold means such that said second OR gate means is responsive to the first timing signal at a first input terminal thereof and is responsive to said second timing signal at a second input terminal thereof, for producing an output signal, and wherein the sample and hold means is responsive to said sixth output signal at the control terminal thereof.

18. The nonlinear noise-blanking circuit of claim 17 wherein the derivative threshold means includes:
differentiator means responsive to the composite signal for producing a first derivative signal;
third comparator means having an inverting input terminal responsive to the derivative reference signal and a non-inverting input terminal responsive to said first derivative signal, for producing a third comparison signal;
second inverter means responsive to said first derivative signal for producing an inverted signal;
fourth comparator means having an inverting input terminal responsive to the derivative reference signal and a non-inverting input terminal responsive to said inverted signal, for producing a fourth comparison signal;
and third OR gate means responsive to said third and fourth comparison signals for producing the derivative threshold signal.

19. The memory nonlinear noise-blanking circuit of claim 11 wherein the first predetermined time is equal to $\Delta t_1$ plus the rise time of the noise signal.

20. A memory nonlinear noise-blanking circuit responsive to a composite signal including an information signal distorted by a noise signal, said memory nonlinear noise-blanking circuit comprising:
delay means responsive to the composite signal for producing a delayed signal;
means for producing a first reference signal;
threshold detector means responsive to said composite signal and said first reference signal for producing a threshold signal, wherein said threshold signal is in a first state when said composite signal exceeds said first reference signal, and wherein said threshold signal is in a second state when said composite signal does not exceed said first reference signal;
timer means responsive to said threshold signal for producing a timing signal, wherein said timing signal is in a first state when said threshold signal is in said first state and wherein said timing signal changes to a second state a predetermined time after said threshold signal changes to said second state;
first sample and hold circuit means having a data input terminal responsive to said delayed signal and a control input terminal responsive to said timing signal, for producing a first sampled signal at an output terminal thereof, wherein while said timing signal is in said first state, said first sampled signal is held constant at a value representative of the value of said delayed signal when said timing signal changed to said first state, and wherein while said timing signal is in said second state said first sampled signal is representative of said delayed signal;
first differentiator means responsive to said delayed signal for producing a first derivative signal;
second sample and hold circuit means having a data input terminal responsive to said first derivative signal and a control input terminal responsive to said timing signal, for producing a second sampled signal at an output terminal thereof, wherein while said timing signal is in said first state said second sampled signal is latched to the value of said first derivative signal when said timing signal changed to said first state, and wherein while said timing signal is in said second state said second sampled signal is representative of said first derivative signal;
synthesis means responsive to said second sampled signal for producing an estimate signal having a linear slope equal to the value of said first derivative signal while said timing signal is in said first state;
and summer means responsive to said delayed signal and said first estimate signal for producing an output signal such that said output signal comprises said delayed signal plus said first estimate signal when said timing signal is in said first state and said output signal comprises said delayed signal when said timing signal is in said second state.

21. The memory nonlinear noise-blanking circuit of claim 20 wherein the information signal is a digital signal.

22. The memory nonlinear noise-blanking circuit of claim 20 wherein the information signal is an analog signal.

23. The memory nonlinear noise-blanking circuit of claim 20 wherein the delay means is an analog delay line having a delay time of $\Delta t_1$, and wherein $\Delta t_1$ is longer than the duration of the noise signal.

24. The memory nonlinear noise-blanking circuit of claim 23 wherein the analog delay line is a charge-coupled device.

25. The memory nonlinear noise-blanking circuit of claim 20 wherein the magnitude of the first reference signal is greater than the magnitude of the information signal, and wherein the magnitude of the first reference signal is exceeded by the composite signal.

26. The memory nonlinear noise-blanking circuit of claim 20 wherein the threshold detector means includes:
first comparator means having an inverting input terminal responsive to the first reference signal and a non-inverting input terminal responsive to the composite signal, for producing a first comparison signal;
inverter means responsive to the composite signal for producing an inverted signal;
second comparator means having an inverting input terminal responsive to the first reference signal and a non-inverting input terminal responsive to the inverted signal for producing a second comparison signal;
and OR gate means responsive to said first output and said second comparison signals, for producing the threshold signal at an output terminal thereof.

27. The memory nonlinear noise-blanking circuit of claim 20 wherein the predetermined time is equal to $\Delta t_1$ plus the rise time of the noise signal.

28. The memory nonlinear noise-blanking circuit of claim 20 including disable means for clearing the synthesis means such that the estimate signal has zero value when the timing signal is in the second state.

29. The memory non-linear noise-blanking circuit of claim 28 wherein the synthesis means includes:
a constant-current source for producing a current determined by the second sampled signal;
a capacitor connected in parallel with said constant-current source wherein the voltage across said capacitor is the estimate signal.

30. The memory nonlinear noise-blanking circuit of claim 29 wherein the disable means includes:
an inverting gate responsive to the timing signal for producing an inverted signal having first and second states;
discharge means responsive to said inverted signal for discharging the capacitor when the timing signal is in said first state, such that the estimate signal has zero value.

31. The memory nonlinear noise-blanking circuit of claim 20 including:
second differentiator means responsive to the first derivative signal for producing a second derivative signal;
third sample and hold circuit means having a data input terminal responsive to said second derivative signal and a control input terminal responsive to the timing signal, for producing a third sampled signal at an output terminal thereof, wherein while the timing signal is in the first state said third sampled signal is latched to the value of said second derivative signal when the timing signal changed to said first state, and wherein while the timing signal is in the second state said third sampled signal is representative of said second derivative signal, and wherein the synthesis means is responsive to said third sampled signal such that the linear slope of the estimate signal changes in accord with said second derivative signal.

32. A memory nonlinear noise-blanking circuit responsive to a composite signal including an information signal distorted by a noise signal, said memory nonlinear noise-blanking circuit comprising:
delay means responsive to the composite signal for producing a delayed signal;
means for producing a first reference signal;
threshold detector means responsive to said composite signal and said first reference signal for producing a threshold signal, wherein said threshold signal is in a first state when said composite signal exceeds said first reference signal, and wherein said threshold signal is in a second state when said composite signal does not exceed said first reference signal;
timer means responsive to said threshold signal for producing a first timing signal, wherein said first timing signal is in a first state when said threshold signal is in said first state, and wherein said first timing signal changes to a second state a first predetermined time after said threshold signal changes to said second state;
one-shot multivibrator means responsive to said first timing signal for producing a second timing signal, wherein said second timing signal is triggered to a first state by the leading edge of said first timing signal and wherein said second timing signal remains in said first state for a second predetermined time, and wherein said second timing signal is in a second state at all other times;
first sample and hold circuit means having a data input terminal responsive to said delayed signal and a control input terminal responsive to said timing signal, for producing a first sampled signal at an output terminal thereof, wherein while said timing signal is in said first state said first sampled signal is held constant at a value representative of the value of said delayed signal when said timing signal changed to said first state, and wherein while said timing signal is in said second state said first sampled signal is representative of said delayed signal;
first differentiator means responsive to said first sampled signal for producing a first derivative signal;
second sample and hold circuit means having a data input terminal responsive to said first derivative signal and a control input terminal responsive to said timing signal, for producing a second sampled signal at an output terminal thereof, wherein while said timing signal is in said first state said second sampled signal is latched to the value of said first derivative signal when said timing signal changed to said first state, and wherein while said timing signal is in said second state said second sampled signal is representative of said first derivative signal;

synthesis means responsive to said second sampled signal for producing an estimate signal having a linear slope equal to the value of said first derivative signal while said second timing signal is in said first state;

and summer means responsive to said delayed signal and said first estimate signal for producing an output signal such that said output signal comprises said delayed signal plus said first estimate signal when said timing signal is in said first state and said output signal comprises said delayed signal when said timing signal is in said second state.

33. The memory nonlinear noise-blanking circuit of claim 32 wherein the information signal is a digital signal.

34. The memory nonlinear noise-blanking circuit of claim 32 wherein the information signal is an analog signal.

35. The memory nonlinear noise-blanking circuit of claim 32 wherein the delay means is an analog delay line having a delay time of $\Delta t_1$, and wherein $\Delta t_1$ is longer than the duration of the noise signal.

36. The memory nonlinear noise-blanking circuit of claim 35 wherein the analog delay line includes a charge-coupled device.

37. The memory nonlinear noise-blanking circuit of claim 35 wherein the magnitude of the first reference signal is greater than the magnitude of the information signal, and wherein the magnitude of the first reference signal is exceeded by the composite signal.

38. The memory nonlinear noise-blanking circuit of claim 32 wherein the threshold detector means includes:

first comparator means having an inverting input terminal responsive to the first reference signal and a non-inverting input terminal responsive to the composite signal for producing a first comparison signal;

inverter means responsive to the composite signal for producing an inverted signal;

second comparator means having an inverting input terminal responsive to the first reference signal and a non-inverting input terminal responsive to the inverted signal for producing a second comparison signal;

and OR gate means responsive to said first and said second comparison signals, for producing the threshold signal at an output terminal thereof.

39. The memory nonlinear noise-blanking circuit of claim 32 wherein the first predetermined time is equal to $\Delta t_1$ plus the rise time of the noise signal.

40. The memory nonlinear noise-blanking circuit of claim 32 including disable means for clearing the synthesis means such that the estimate signal has zero value when the timing signal is in the second state.

41. The memory non-linear noise-blanking circuit of claim 40 wherein the synthesis means includes:

a constant-current source for producing a current determined by the second sampled signal;

a capacitor connected in parallel with said constant-current source wherein the voltage across said capacitor is the estimate signal.

42. The memory nonlinear noise-blanking circuit of claim 41 wherein the disable means includes:

an inverting gate responsive to the second timing signal for producing an inverted signal having first and second states;

and discharge means responsive to said inverted signal for discharging the capacitor when the second timing signal is in said first state, such that the estimate signal has zero value.

43. The memory nonlinear noise-blanking circuit of claim 32 including:

second differentiator means responsive to the first derivative signal for producing a second derivative signal;

third sample and hold means having a data input terminal responsive to said second derivative signal and a control input terminal responsive to the timing signal, for producing a third sampled signal at an output terminal thereof, wherein while the timing signal is in the first state said third sampled signal is latched to the value of said second derivative signal when the timing signal changed to the first state, and wherein while the timing signal is in the second state said third sampled signal is representative of said second derivative signal, and wherein the synthesis means is responsive to said third sampled signal such that the linear slope of the estimate signal changes in accord with said second derivative signal.

44. The memory nonlinear noise-blanking circuit of claim 32 including bandpass filter means disposed between the first sample and hold circuit means and the first differentiator means, wherein said bandpass filter means is responsive to the first sampled signal for producing a filtered signal, and wherein the first differentiator means is responsive to said filtered signal.

45. A memory nonlinear noise-blanking circuit responsive to a composite signal including an information signal distorted by a noise signal having a period of $\Delta t$, said memory nonlinear noise-blanking circuit comprising:

delay means responsive to the composite signal for producing a delayed signal;

means for producing a first reference signal;

threshold detector means responsive to said composite signal and said first reference signal for producing a threshold signal, wherein said threshold signal is in a first state when said composite signal exceeds said first reference signal, and wherein said threshold signal is in a second state when said composite signal does not exceed said first reference;

timer means responsive to said threshold signal for producing a timing signal, wherein said timing signal is in a first state when said threshold signal is in said first state, and wherein said timing signal changes to a second state a first predetermined time after said threshold signal has returned to said second state;

first sample and hold means having a data input terminal responsive to said delayed signal and a control input terminal responsive to said timing signal for producing a first sampled signal at an output terminal thereof, wherein while said timing signal is in said first state said first sampled signal is held constant at a value respresentative of the value of said delayed signal when said timing signal changed to said first state, and wherein while said timing signal is in said second state said first sampled signal is representative of said delayed signal;

first differentiator means responsive to said first sampled signal for producing a first derivative signal;

first amplifier means responsive to said first derivative signal for producing a first amplified signal, wherein said first amplifier means has a gain of $\Delta t$;

second sample and hold means circuit having a data input terminal responsive to said first amplified signal and a control input terminal responsive to said first timing signal for producing a second sampled signal at an output terminal thereof, wherein while said timing signal is in said first state said second sampled signal is latched to the value of said first amplified signal when said timing signal changed to said first state, and wherein while said timing signal is in said second state said second sampled signal is representative of said first amplified signal;

summer means responsive to said first and said second sampled signals for producing an output signal such that said output signal comprises the sum of said first and said second sampled signals.

46. The memory nonlinear noise-blanking circuit of claim 45 wherein the information signal is a digital signal.

47. The memory nonlinear noise-blanking circuit of claim 45 wherein the information signal is an analog signal.

48. The memory nonlinear noise-blanking circuit of claim 45 wherein the delay means is an analog delay line having a delay time of $\Delta t_1$, and wherein $\Delta t_1$ is longer than the duration of noise signal.

49. The memory nonlinear noise-blanking circuit of claim 45 wherein the analog delay line includes a charge-coupled device.

50. The memory nonlinear noise-blanking circuit of claim 45 wherein the magnitude of the first reference signal is greater than the magnitude of the information signal, and wherein the magnitude of the first reference signal is exceeded by the composite signal.

51. The memory nonlinear noise-blanking circuit of claim 45 wherein the threshold detector means includes:
first comparator means having an inverting input terminal responsive to the first reference signal and a non-inverting input terminal responsive to the composite signal, for producing a first comparison signal;
inverter means responsive to the composite signal for producing an inverted signal;
second comparator means having an inverting input terminal responsive to the first reference signal and a non-inverting input terminal responsive to the inverted signal for producing a second comparison signal;
and OR gate means responsive to said first and to said second comparison signals, for producing the threshold signal at an output terminal thereof.

52. The memory nonlinear noise-blanking circuit of claim 45 wherein the first predetermined time is equal to $\Delta t_1$ plus the rise time of the noise signal.

53. The memory nonlinear noise-blanking circuit of claim 45 including:
second differentiator means responsive to the first derivative signal for producing a second derivative signal;
second amplifier means responsive to said second derivative signal for producing a second amplified signal, wherein said second amplifier means has a gain of $(\Delta t)^2/2!$;
third sample and hold circuit means having a data input terminal responsive to said second amplified signal and a control input terminal responsive to the timing signal for producing a third sampled signal at an output terminal thereof, wherein while said timing signal is in said first state said third sampled signal is latched to the value of said second amplified signal when said timing signal changed to said first state, and wherein while said timing signal is in said second state said third sampled signal is representative of said second amplified signal, and wherein said summer means is responsive to said third sampled signal.

54. The memory nonlinear noise-blanking circuit of claim 45 including bandpass filter means disposed between the first sample and hold circuit means and the first differentiator means, wherein said bandpass filter means is responsive to the first sampled signal for producing a filtered signal, and wherein the first differentiator means is responsive to said filtered signal.

55. A memory nonlinear noise-blanking circuit responsive to a composite signal including an information signal distorted by a noise signal, said memory nonlinear noise-blanking circuit comprising:
first delay means responsive to the composite signal for producing a delayed signal, wherein the delayed signal lags the composite signal by a first predetermined time;
predictor means responsive to said composite signal for producing a prediction signal representative of the expected future trajectory of said composite signal, wherein said predictor means has a predetermined lead time;
means for producing a first reference signal;
first threshold detector means responsive to said composite, prediction, and first reference signals for producing a first threshold signal, wherein said first threshold signal is in a first state when the difference between said composite and prediction signals exceeds said first reference signal, and wherein said first threshold signal is in a second state when the difference between said composite and prediction signals does not exceed said first reference signal;
first timer means responsive to said first threshold signal for producing a first timing signal, wherein said first timing signal is in a first state when said first threshold signal is in said first state, and wherein said first timing signal changes to a second state a second predetermined time after said first threshold signal changes to said second state;
second delay means responsive to said prediction signal for producing a delayed prediction signal, wherein the delayed prediction signal lags the prediction signal by said first predetermined time;
and first gate means responsive to said delayed, first timing, and delayed prediction signals for producing an output signal, wherein said output signal represents said delayed prediction signal when said first timing signal is in said first state, and represents said delayed signal when said first timing signal is in said second state.

56. The memory nonlinear noise-blanking circuit of claim 55 wherein the information signal is a digital signal.

57. The memory nonlinear noise-blanking circuit of claim 55 wherein the information signal is an analog signal.

58. The memory nonlinear noise-blanking circuit of claim 55 wherein the first delay means is an analog delay line having a delay time of $\Delta t_1$, and wherein $\Delta t_1$ is longer than the duration of the noise signal.

59. The memory nonlinear noise-blanking circuit of claim 58 wherein the analog delay line includes a charge-coupled device.

60. The memory nonlinear noise-blanking circuit of claim 55 including:
   means for producing a second reference signal;
   second threshold detector means responsive to the composite signal and said second reference signal for producing a second threshold signal, wherein said second threshold signal is in a first state when the composite signal exceeds said second reference signal and wherein said threshold signal is in a second state when the composite signal does not exceed said second reference signal;
   second timer means responsive to said second threshold signal for producing a second timing signal, wherein said second timing signal is in a first state when said second threshold signal is in a first state, and wherein said second timing signal changes to a second state a third predetermined time after said second threshold signal changes to said second state;
   sample and hold circuit means disposed between the first delay means and the first gate means such that said sample and hold means is responsive to the delayed signal at a data input terminal thereof, said sample and hold circuit means having a control input terminal responsive to said second timing signal, for producing a sampled signal at an output terminal thereof, wherein while said second timing signal is in said first state said sampled signal is held constant at a value representative of the value of said delayed signal when said second timing signal changed to said first state, and wherein while said second timing signal is in said second state said sampled signal is representative of said delayed signal, and wherein the first gate means is responsive to said sampled signal.

61. The memory nonlinear noise-blanking circuit of claim 60 wherein the magnitude of the second reference signal is greater than the magnitude of the information signal and wherein the magnitude of the second reference signal is exceeded by the composite signal distorted by the noise signal.

62. The memory nonlinear noise-blanking circuit of claim 60 wherein the second threshold detector means includes:
   first comparator means having an inverting input terminal responsive to the second reference signal and a non-inverting input terminal responsive to the composite signal, for producing a first comparison signal;
   inverter means responsive to the composite signal for producing an inverted signal;
   second comparator means having an inverting input terminal responsive to the second reference signal and a non-inverting input terminal responsive to said inverted signal for producing a second comparison signal;
   and OR gate means responsive to said first and said second comparison signals for producing the second threshold signal at an output terminal thereof.

63. The memory nonlinear noise-blanking circuit of claim 60 wherein the third predetermined time is equal to $\Delta t_1$ plus the rate time of the noise signal.

64. The memory nonlinear noise-blanking circuit of claim 60 including:
   second gate means having a data input terminal responsive to the composite signal and a control input terminal responsive to the second timing signal for producing a first signal at an output terminal thereof, wherein said first signal has zero magnitude when the second timing signal is in the first state, and wherein said first signal is representative of the composite signal when the second timing signal is in the second state;
   bandpass filter means responsive to said first signal for producing a filtered signal wherein said bandpass filter means has a predetermined delay time;
   and wherein the predictor means is disposed between said bandpass filter means and the second delay means such that the predictor means is responsive to said filtered signal, and such that the second delay means is responsive to the prediction signal.

65. The memory nonlinear noise-blanking circuit of claim 55 wherein the first threshold detector means includes:
   summer means having an inverting input terminal responsive to the composite signal and a non-inverting input terminal responsive to the prediction signal for producing a difference signal representative of the difference between the composite and the prediction signals;
   first comparator means having an inverting input terminal responsive to the first reference signal and a non-inverting input terminal responsive to said difference signal, for producing a first comparison signal;
   inverter means responsive to said difference signal for producing an inverted signal;
   second comparator means having an inverting input terminal responsive to the first reference signal and a non-inverting input terminal responsive to said inverted signal for producing a second comparison signal;
   and gate means responsive to said first and said second comparison signals for producing the first threshold signal at an output terminal thereof.

66. The memory nonlinear circuit of claim 58 including one-shot multivibrator means disposed between the first timer means and the first gate means, wherein said one-shot multivibrator means is responsive to the first timing signal for producing a second timing signal, wherein said second timing signal is triggered to a first state by a leading edge of the first timing signal and wherein said second timing signal remains in said first state for a fourth predetermined time, and wherein said second timing signal is in a second state at all other times and wherein the first gate means is responsive to said second timing signal.

67. The memory nonlinear noise-blanking circuit of claim 55 wherein the second delay means is an analog delay line having a delay time of $\Delta t_1$.

68. The memory nonlinear noise-blanking circuit of claim 67 wherein the analog delay line includes a charge-coupled device.

* * * * *